United States Patent
Hachisuka et al.

(12)

(10) Patent No.: US 6,218,235 B1
(45) Date of Patent: Apr. 17, 2001

(54) METHOD OF MANUFACTURING A DRAM AND LOGIC DEVICE

(75) Inventors: Atsushi Hachisuka; Hiroyasu Nohsoh; Shinya Soeda, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/542,876

(22) Filed: Apr. 4, 2000

(30) Foreign Application Priority Data

Jul. 8, 1999 (JP) .................................................. 11-194319
Oct. 1, 1999 (JP) .................................................. 11-281097

(51) Int. Cl.$^7$ ............................................. H01L 21/8242
(52) U.S. Cl. ............................................. 438/241; 438/656
(58) Field of Search .................................. 438/210, 241, 438/253, 396, 655, 656

(56) References Cited

U.S. PATENT DOCUMENTS 5,728,595 * 3/1998 Fukase .................................. 438/241
6,004,843 * 12/1999 Huang .................................. 438/241

FOREIGN PATENT DOCUMENTS 11-68103    3/1999   (JP) .

* cited by examiner

*Primary Examiner*—Chandra Chaudhari
(74) *Attorney, Agent, or Firm*—McDermott, Will & Emery

(57) ABSTRACT

A method of manufacturing a semiconductor device having a memory device and a logic device on the same semiconductor substrate is provided without reducing reliability of the semiconductor device and making a manufacturing process unnecessarily complicated. A silicon oxide film which serves as a salicide protection film in the logic device formation region is subjected to wet isotropic etching. The process completely removes the silicon oxide film in the memory device formation region. Thus, the silicon oxide film is left only in a prescribed portion in the logic device formation region. As a result, the silicon oxide film is not left on an inner wall of a recess formed by a silicon nitride film between gate electrodes. Consequently, a good self alignment contact opening is formed toward a source/drain region in the memory device formation region.

19 Claims, 27 Drawing Sheets

MEMORY DEVICE FORMATION REGION

LOGIC DEVICE FORMATION REGION

MEMORY DEVICE FORMATION REGION

LOGIC DEVICE FORMATION REGION

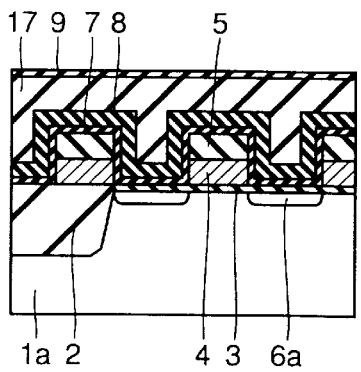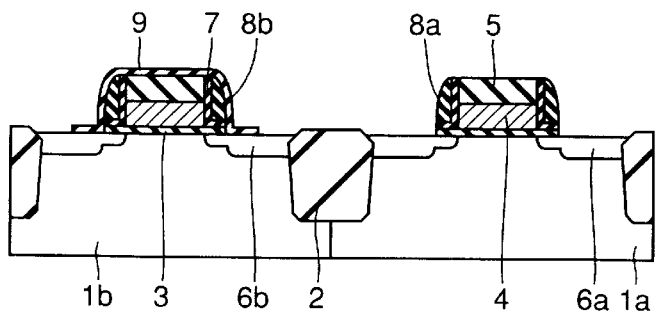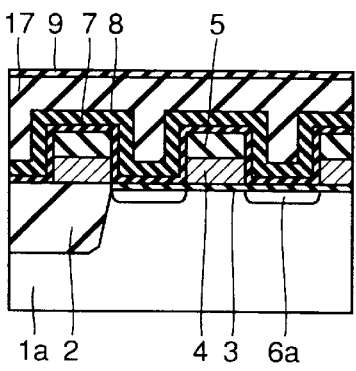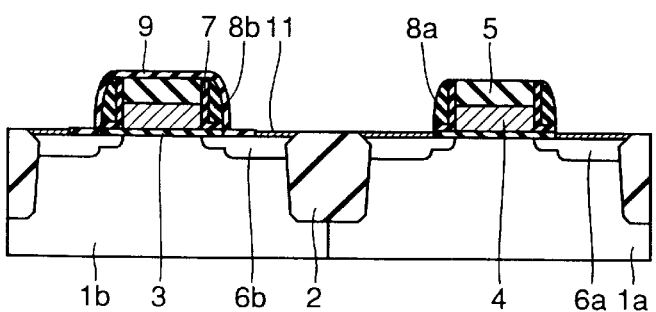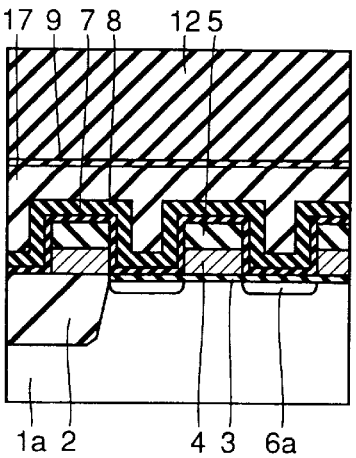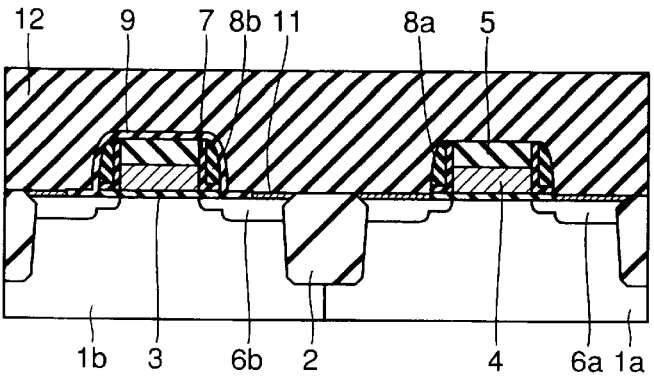

FIG.58A PRIOR ART
FIG.58B PRIOR ART
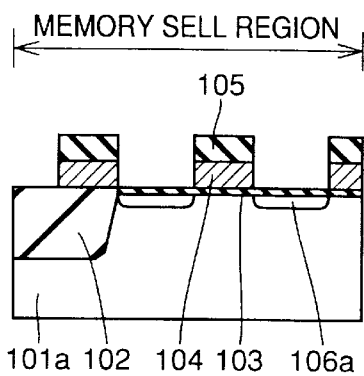
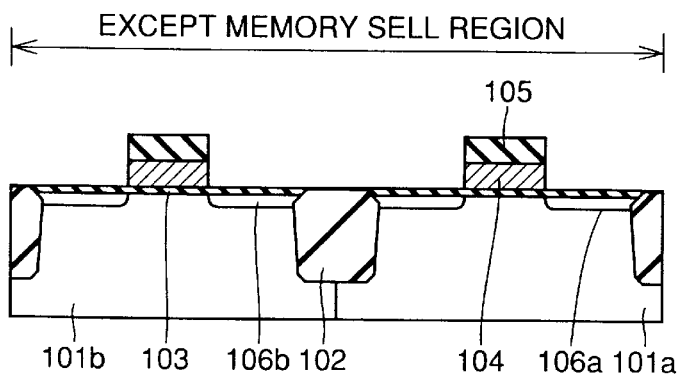
FIG.59A PRIOR ART
FIG.59B PRIOR ART
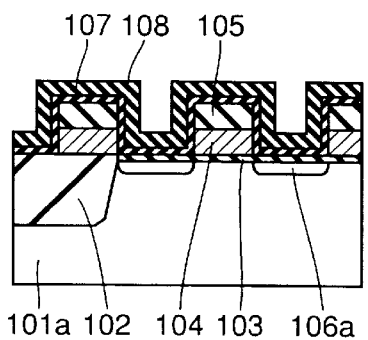
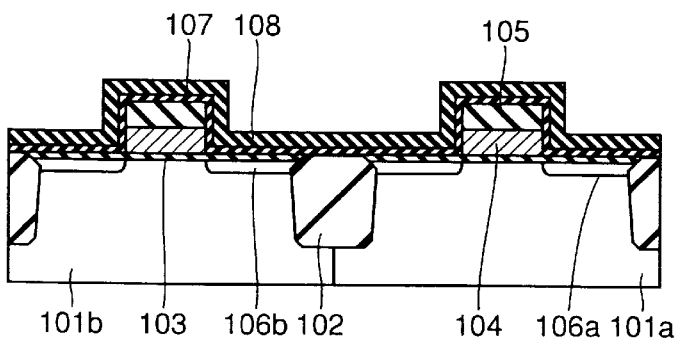
FIG.60A PRIOR ART
FIG.60B PRIOR ART
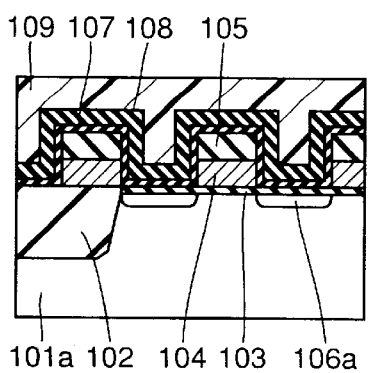
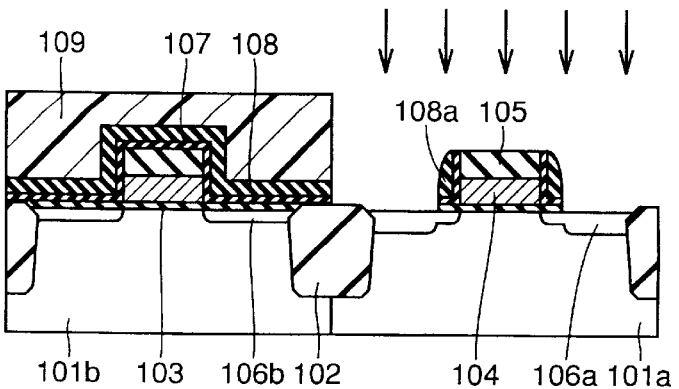

METHOD OF MANUFACTURING A DRAM AND LOGIC DEVICE

BACKGROUND OF THE INVENTION

1. Field of the Invention

The present invention relates to methods of manufacturing semiconductor devices and, more specifically, to a method of manufacturing a semiconductor device in which a memory device formed by a self alignment contact process and a logic device formed by a salicide process (such a semiconductor device is hereinafter referred to as "a mixed device") are arranged on the same semiconductor substrate.

2. Description of the Background Art

Recently, semiconductor devices are required to be smaller and highly integrated. Among memory devices such as DRAMs (Dynamic Random Access Memories), for example, there is a device which can even store information of 1 Gigabit in one chip.

Multimedia development requires that the semiconductor devices are smaller and light weighted while having complicated functions. To satisfy all of the above mentioned requirements, the latest semiconductor devices must be provided with various devices in one chip. The most typical example is that memory and logic devices are formed on the same semiconductor substrate in one chip.

Conventionally, various microminiaturization pattern forming techniques have been developed for memory devices such as DRAMs. Among these techniques, there is a self alignment contact (hereinafter abbreviated as "SAC") technique. Generally, an alignment error of masks is taken into account a process of forming a contact hole. For example, an opening pattern of a mask for a gate electrode and that for a contact hole in a source/drain region are designed to allow for a margin in alignment. However, as SAC does not require consideration of alignment tolerance for the opening pattern of the mask, it is considered a significant technique for forming a memory device.

Now, referring to FIGS. 58A to 66A as well as FIGS. 58B to 66B, a conventional SAC process for a DRAM device will be described.

FIGS. 58A to 66A show memory cell regions, whereas FIGS. 58B to 66B show peripheral circuit regions or the like which are outside the memory cell regions. In the conventional SAC process of the DRAM device, first, as shown in FIGS. 58A and 58B, an isolation oxide film 102 is formed by trench isolation in well regions 101a and 101b in a semiconductor substrate. A gate insulating film 103 is formed by thermal oxidation or the like in a device formation region which has been separatedly formed by isolation oxide film 102. Then, a gate electrode 104 and an insulating film 105 including a silicon nitride film are formed by using the same mask. A source/drain region 106a is formed in a p well region 101a by implanting n type impurities by means of ion implantation or the like. In addition, a source/drain region 106b is formed in an n well region 101b by implantation of p type impurities.

Thereafter, as shown in FIGS. 59A and 59B, a silicon oxide film 107 and silicon nitride film 108 are sequentially formed to cover a main surface of the semiconductor substrate. In forming silicon oxide film 107, any of CVD (Chemical Vapor Deposition) and oxidation may be used.

As shown in FIGS. 60A and 60B, a resist film is formed on silicon nitride film 108. Thereafter, the resist film is subjected to photolithography for forming an n type transistor region other than in the memory cell region. Then, the resist film in the n type transistor region other than in the memory cell region is etched. A resist film 109 is formed in the n type transistor region in the memory cell region and in the p type transistor region other than in the memory cell region. Then, silicon nitride film 107, silicon oxide film 108 and gate insulating film 103 are subjected to anisotropic etching using resist film 109 as a mask. A sidewall nitride film 108a of a transistor is thereby formed. Then, n type impurities are further implanted to the n type transistor region in the memory cell region using insulating film 105 and sidewall nitride film 108a as masks, so that source/drain region 106a comes to have an LDD (Lightly Doped Drain) structure.

Then, a resist film is formed to cover an entire surface of the semiconductor substrate. The resist film is subjected to photolithography for forming a p type transistor region other than in the memory cell region. The resist film in the p type transistor region other than in the memory cell region is etched. Thus, a resist film 110 is formed. Silicon nitride film 108 is subjected to anisotropic etching using resist film 110 as a mask, so that a sidewall nitride film 108b is formed. Then, the p type impurities are further implanted to the n type transistor region using insulating film 105 and sidewall nitride film 108b as masks in the p type transistor region, so that source/drain region 106b comes to have the LDD structure. As a result, the structure as shown in FIGS. 61A and 61B is obtained. Here, the conductivity type of the well region and that of impurities to be implanted are not limited to the above mentioned conductivity type, and mutually opposite conductivity types may be employed. Then, resist film 110 is removed.

As shown in FIGS. 62A and 62B, a silicon oxide film including boron and phosphorus, that is, a BPSG (Boro Phospho Silicate Grass) film 111 is formed to cover the entire surface of the semiconductor substrate. Thereafter, the surface of BPSG film 111 is subjected to a thermal treatment or a planarization process such as CMP (Chemical Mechanical Polishing). A silicon oxide film 112 is formed on BPSG film 111.

Successively, a resist film is formed on silicon oxide film 112. As shown in FIGS. 63A and 63B, a resist film 113 is formed in a pattern for forming a self alignment contact opening between gate electrodes in the memory cell region.

Referring to FIGS. 64A and 64B, silicon oxide film 112 and BPSG film 111 are subjected to anisotropic etching using resist film 113 as a mask and silicon nitride film 108 as an etching stopper in the memory cell region. As shown in FIGS. 65A and 65B, resist film 113 is removed.

Now, referring to FIGS. 66A and 66B, silicon nitride film 108 and silicon oxide film 107 are sequentially subjected to anisotropic etching using silicon oxide film 112 and BPSG film 111 as masks. Thus, a self alignment contact hole 114 is formed. A conductive material (not shown) for forming an interconnection layer for a bit line or the like is buried in self alignment contact hole 114. As a result, source/drain region 106a formed in the semiconductor substrate and other conductive layers are electrically connected.

On the other hand, in the logic device formation region, to simultaneously reduce a parasitic resistance of the source/drain region and an interconnection resistance of the gate electrode, a technique referred to as salicide (Salicide: Self-aligned Silicide) for forming selectively and in a self-aligning manner a refractory metal silicide film on the surface of the gate electrode in the source/drain region. Referring to FIGS. 67 to 72, the salicide process will be described.

A method of manufacturing the structure shown in FIG. 67 is performed in a similar manner as that of forming the region other than the memory cell region shown in FIGS. 58B to 61B.

As shown in FIG. 68, a silicon oxide film 115 including a salicide protection film is formed to cover the entire surface of the semiconductor substrate. Then, a resist film is formed to cover the entire surface of the semiconductor substrate. Photolithography is performed such that the resist film is left only in the portion where silicon oxide film 115 is to be left. By etching the resist film not in the portion where silicon oxide film 115 is to be left, a resist film 116 is formed as shown in FIG. 69. Silicon oxide film 115 is subjected to anisotropic etching using resist film 116 as a mask. Resist film 116 is removed. This results in the structure shown in FIG. 70. Successively, referring to FIG. 71, a refractory metal silicide film 117 such as a cobalt silicide film or a titanium silicide film is formed on an active region of the exposed semiconductor substrate. Then, a BPSG film 118 is formed to cover the entire surface of the semiconductor substrate. BPSG film 118 is subjected to a thermal treatment or a planarization process such as CMP. A silicon oxide film 119 is formed on BPSG film 118. This results in a structure shown in FIG. 72.

Conventionally, in manufacturing a semiconductor device in which a memory device formed by SAC and a logic device formed by a salicide process are arranged in the same semiconductor substrate, the following problems arise. Referring to FIGS. 73A to 81A as well as FIGS. 73B to 81B, the problems associated with such mixed devices will be described. FIGS. 73A to 81A show memory device formation regions, whereas FIGS. 73B to 81B show logic device formation regions.

A method of manufacturing the structure shown in FIGS. 73A and 73B is performed in a manner similar to that of manufacturing the memory device which has been described with reference to FIGS. 58A to 61A as well as 58B to 61B. As shown in FIGS. 74A and 74B, a silicon oxide film 120 corresponding to a salicide protection film of the logic device is formed to cover the entire surface of the semiconductor substrate. Then, a resist film 121 is formed to cover the entire surface of the semiconductor substrate. The resist film in the portion where silicon oxide film 120 is to be left in the logic device formation region is subjected to photolithography. By etching the resist film, a resist film 121 is formed. This results in a structure shown in FIGS. 75A and 75B.

Silicon oxide film 120 is subjected to anisotropic etching using resist film 121 as a mask. Resist film 121 is removed. This results in a structure shown in FIGS. 76A and 76B. Silicon oxide film 120 is left on an inner wall of a recess formed by silicon nitride film 108 as a side wall oxide film in the memory device formation region. In addition, a thickness of silicon nitride film 108 on silicon nitride film 105 is reduced as silicon oxide film 120 has been over etched.

As shown in FIGS. 77A and 77B, a refractory metal silicide film 122 is formed in an active region where the semiconductor substrate is exposed in the logic device formation region. Then, a BPSG film 123 is formed to cover the entire surface of the semiconductor substrate. BPSG film 123 is subjected to a thermal treatment or a planarization process such as CMP. A silicon oxide film 124 is formed on BPSG film 123. This results in a structure shown in FIGS. 78A and 78B. A distance between inner walls of the recess formed by silicon nitride film 108 is small as silicon oxide film 120 is left on the inner wall of the recess formed by silicon nitride film 108. Thus, an aspect ratio of the recess formed by silicon nitride film 108 is high. As a result, BPSG film 123 is not completely filled in the recess formed by silicon nitride film 108. Thus, a cavity 125 is formed in BPSG film 123 in the recess formed by silicon nitride film 108.

Referring to FIGS. 79A and 79B, a resist film is formed to cover the entire surface of the semiconductor substrate. The resist film is subjected to photolithography for patterning the self alignment contact opening in the memory device formation region. By etching to remove the resist film in the self alignment contact opening, a resist film 126 is formed in a pattern. Thereafter, as shown in FIGS. 80A and 80B, silicon oxide film 124 and BPSG film 123 are sequentially subjected to anisotropic etching. A resist film 126 is removed. Silicon nitride film 108 and silicon oxide film 107 are subjected to anisotropic etching using silicon oxide film 124 and BPSG film 123 as masks. Thus, a self alignment contact opening 127 is formed. This results in the structure shown in FIGS. 81A and 81B.

As described above, in the conventional mixed device, silicon oxide film 120 which has been formed as the salicide protection film is left on the inner wall of the recess formed by silicon nitride film 108 in self alignment contact opening 127. Generally, it is difficult to etch the silicon oxide film as it does not include impurities such as boron or phosphorus. In addition, essentially, the portion near the inner wall of the recess formed by silicon nitride film 108 is difficult to be etched. Thus, silicon oxide film 120 would not be etched but left. As a result, an aspect ratio of self alignment contact opening 127 is high. A conductive material (not shown) cannot accurately be buried in self alignment contact opening 127. Consequently, good electric connection of an interconnection layer (not shown) formed in self alignment contact opening 127 and source/drain 106a is not achieved.

Further, in the memory device formation region, a distance between the inner walls of the recess formed by silicon nitride film 108 is reduced by the left silicon oxide film 120. The aspect ratio of the recess formed by silicon nitride film 108 increases. As a result, cavity 125 is formed in BPSG film 123 in the recess formed by silicon nitride film 108 as described above. Cavity 125 prevents transistors to be surely insulated, thereby disadvantageously reducing reliability of the semiconductor device.

In addition, in the mixed device, over etching silicon oxide film 120 in the memory device formation region may result in a reduced thickness of silicon nitride film 108 or removal of silicon nitride film 108, depending on the situation. Therefore, an upper surface of gate electrode 104 may be exposed. If gate electrode 104 is exposed, a short circuit between the interconnection layer formed in self alignment contact opening 127 and gate electrode 104 is caused.

Therefore, in manufacturing a mixed device, it is important to make use of the process which has been used for each device to the full while not making the process unnecessarily complicated.

SUMMARY OF THE INVENTION

One object of the present invention is to provide a method of manufacturing a semiconductor device capable of forming a mixed device in which different devices are formed on the same semiconductor substrate while not making a manufacturing process complicated.

Another object of the present invention is to provide a method of manufacturing a semiconductor device preventing reduction in reliability of the semiconductor device even when different devices are formed on the same semiconductor substrate.

According to one aspect of the present invention, a method of manufacturing a semiconductor device having a memory device formation region and a logic device formation region on a semiconductor substrate includes steps of: forming first and second gate electrodes on the semiconductor substrate in the memory device formation region and forming a third gate electrode on the semiconductor substrate in the logic device formation region; forming first source/drain regions in the semiconductor substrate on both sides of each of the first and second gate electrodes and forming second source/drain regions in the semiconductor substrate on both sides of the third gate electrode; forming a first insulating film on the entire surface of the semiconductor substrate to cover the first, second and third gate electrodes; performing anisotropic etching on the first insulating film formed on the logic device formation region to leave a first protection insulating film covering the first and second gate electrodes in the memory device formation region and forming a sidewall insulating film on a side wall of the third gate electrode; forming a second insulating film to cover the entire surface of the semiconductor substrate including the first, second and third gate electrodes, the first protection insulating film, and the sidewall insulating film; selectively performing wet etching on the second insulating film in the memory device region to form a salicide protection film in the logic device formation region; forming a refractory metal silicide film on the second source/drain region exposing the semiconductor substrate in the logic device formation region; forming an interlayer insulating film to cover the entire surface of the semiconductor substrate; and etching the interlayer insulation film and the first protection insulating film in the memory device formation region to form a contact hole leading to the first source/drain region of the semiconductor substrate in a self-aligning manner such that the second protection insulating film is left on the upper surfaces and sidewalls of the first and second gate electrodes.

In the method of manufacturing the semiconductor device according to one aspect of present invention, the second insulating film is etched by wet isotropic etching in the step of etching the second insulating film. Thus, the second insulating film in the memory device formation region is completely removed. As a result, the second insulating film is not left on the inner wall of a recess formed by the first insulating film between the first and second gate electrodes. Thus, an aspect ratio of a self alignment contact opening leading to the first source/drain region decreases. Accordingly, when an interconnection layer for electric connection to the first source/drain region is formed to bury the self alignment contact opening leading to the first source/drain region, the interconnection layer is properly buried. Thus, good electric connection is obtained between the interconnection layer buried in the self alignment contact opening leading to the first source/drain region and the first source/drain region formed in the semiconductor substrate. As a result, reliability of the semiconductor device increases.

Further, in the mixed device of the present invention, the second insulating film is not left in the recess formed by the first insulating film covering the first and second gate electrodes. Thus, the aspect ratio of the recess formed by the first insulating film decreases. Accordingly, a cavity is not formed in the interlayer insulating film in the recess formed by the first insulating film between the first and second gate electrodes in the region where the contact hole is not formed. Insulation of the first and second gate electrodes are thereby ensured, so that reliability of the semiconductor device increases.

In the method of manufacturing a mixed device of the present invention, the second insulating film is removed by wet etching, so that the first insulating film is not over etched as in the case of removing the second insulating film by dry etching. Accordingly, a thickness of the second insulating film on the first gate electrode is not decreased, or the second insulating film is not completely removed. Consequently, a short-circuit of the first gate electrode and an interconnection connected to the first source/drain region, which is caused by exposure of the first gate electrode, is prevented. As a result, reliability of the semiconductor device increases.

In the method of manufacturing the semiconductor device of the present invention, the first insulating film may be a silicon nitride film.

In the method of manufacturing the semiconductor device according to the present invention, the second insulating film may be a silicon oxide film.

More preferably, in the method of manufacturing the semiconductor device according to one aspect of the present invention, the interlayer insulating film is an insulating film including impurities. Further, a step of forming an insulating film not including impurities on the refractory metal silicide film is provided after the step of forming the refractory metal silicide film and before the step of forming the interlayer insulating film. In addition, a step of performing a thermal treatment on the interlayer insulating film is provided after the step of forming the interlayer insulating film.

Such a manufacturing method allows formation of a thin film not including impurities between the refractory metal silicide film and the film including impurities. Thus, diffusion of the impurities into the semiconductor substrate is prevented even when the thermal treatment is performed, so that a transistor is not adversely affected.

In the method of manufacturing the semiconductor device according to the present invention, the impurities may include at least one of boron and phosphorus.

In the method of manufacturing the semiconductor device according to the present invention, the insulating film not including impurities may be a silicon oxide film having a thickness of at most 300 Å.

More preferably, in the method of manufacturing the semiconductor device according to one aspect of the present invention, the insulating film not including impurities may be a silicon nitride film having a thickness of at most 300 Å.

Such a manufacturing method allows the thin silicon nitride film to prevent oxidation of the semiconductor substrate and the refractory metal silicide film, so that planarization by the thermal treatment can be performed in an oxidation atmosphere. As a result, good planarization is effectively achieved as compared with a case of planarization by the thermal treatment in a non-oxidation atmosphere.

A method of manufacturing a semiconductor device having a memory device formation region and a logic device formation region on a semiconductor substrate according to another aspect of the present invention include steps of: forming first and second gate electrodes in the memory device formation region and forming a third gate electrode on the semiconductor substrate in the logic device formation region; forming first source/drain regions in the semiconductor substrate on both sides of the first and second gate electrodes and forming second source/drain regions on both sides of the third gate electrode; forming a first insulating film on the entire surface of the semiconductor substrate to cover the first, second and third gate electrodes; forming an insulating film including impurities on the first insulating film; removing the insulating film including impurities formed in the logic device formation region; performing anisotropic etching on the first insulating film in the logic device formation region to leave a first protection insulating film in the memory cell formation region and forming a sidewall insulating film on a side wall of the third gate electrode; forming a second insulating film to cover the entire surface of the semiconductor substrate; etching the second insulating film to form a salicide protection film in the logic device formation region; forming a refractory metal silicide film on the second source/drain region exposing the semiconductor substrate in the logic device formation region; forming an interlayer insulating film on the semiconductor substrate; forming a contact hole leading to the first source/drain region of the semiconductor substrate in a self-aligning manner in the interlayer insulating film and the insulating film including impurities in the memory device formation region such that a second protection insulating film is left on the upper surfaces and side walls of the first and second gate electrodes; and performing a thermal treatment on the surface of the silicon oxide film or interlayer insulating film after one of the step of forming the insulating film including impurities and the step of forming the interlayer insulating film.

In the method of manufacturing the semiconductor device according to another aspect of the present invention, the insulating film including impurities is formed on the first insulating film covering the first and second gate electrodes. This facilitates etching of the film including impurities, so that the second insulating film formed on an inner wall of a recess formed by the first insulating film is completely etched without leaving any etching residue. Accordingly, as in the method of manufacturing the semiconductor device according to one aspect of the present invention, a good contact hole is formed in a self-aligning manner such that the second protection insulating film is left on the upper surfaces and the side walls of the first and second gate electrodes. The interconnection layer is properly buried when forming the interconnection layer for electric connection to the first source/drain region on the semiconductor substrate, so that reliability of the semiconductor device effectively increases.

Further, planarization of the film including impurities by the thermal treatment in an oxidation atmosphere is performed using the first insulating film for forming the sidewall insulating film of the transistor as an oxidation preventing film for the semiconductor substrate. Thus, as compared with the above described method of manufacturing the semiconductor device, the number of forming the first insulating films is reduced and, corresponding reduction in the number of steps is achieved.

Further, formation of the film including impurities on the first insulating film prevents diffusion of the impurities into the semiconductor substrate, so that a transistor is not adversely affected.

In the method of manufacturing the semiconductor device according to another aspect of the present invention, the first insulating film may be a silicon nitride film.

In the method of manufacturing the semiconductor device according to another aspect of the present invention, the second insulating film may be a silicon oxide film.

In the method of manufacturing the semiconductor device according to another aspect of the present invention, the impurities may include at least one of boron and phosphorus.

Preferably, in the method of manufacturing the semiconductor device according to another aspect of the present invention, etching of the silicon oxide film completely removes the silicon oxide film formed in the memory device formation region.

According to such a manufacturing method, the second insulating film in the memory device formation region is completely removed when forming the second insulating film as a salicide protection film. This produces the same effect as in the case of the method of manufacturing the semiconductor device according to another aspect of the present invention. In addition, as the silicon oxide film in the memory device formation region is removed, a depth of the contact hole leading to the first source/drain region through the interlayer insulating film decreases to allow for an increased etching margin. Here, the etching margin refers to a tolerance with respect to the actual size. More specifically, it is a tolerance with respect to a preliminary set error to enable good connection to the intended portion if a diameter of the contact hole is formed greater than desired, or if a position of the opening of the contact hole is formed offset.

A method of manufacturing a semiconductor device having a memory device formation region and a logic device formation region on a semiconductor substrate according to still another aspect of the present invention includes steps of: forming first and second gate electrodes in the memory device formation region and forming a third gate electrode on the semiconductor substrate in the logic device formation region; forming first source/drain regions in the semiconductor substrate on both sides of the first and second gate electrodes and forming third source/drain regions in the semiconductor substrate on both sides of the third gate electrode; forming a first insulating film on the entire surface of the semiconductor substrate to cover the first, second and third gate electrodes; performing anisotropic etching on the first insulating film formed in the logic device formation region to leave a first protection insulating film in the memory device formation region; forming a sidewall insulating film on a side wall of the third gate electrode; forming an insulating film including impurities on the entire surface of the semiconductor substrate; etching the insulating film including impurities to form a salicide protection film in the logic device formation region; forming a refractory metal silicide film on the second source/drain region exposing the semiconductor substrate in the logic device formation region; forming an interlayer insulating film on the semiconductor substrate; and forming a contact hole leading to the first source/drain region of the semiconductor substrate in a self aligning manner in the interlayer insulating film and the insulating film including impurities in the memory device formation region such that a second protection insulating film is left on the upper surfaces and side walls of the first and second gate electrodes.

According to such a manufacturing method, a space between the first and second gate electrodes in the memory device formation region is filled with the film including impurities. Thus, the second insulating film is not left on an inner wall of a recess formed by the first insulating film covering the first and second gate electrodes. Accordingly, as in the above described method of manufacturing the semiconductor device, a good contact hole is formed in the self-aligning manner to leave the second protection insulating film on the upper surfaces and side walls of the first and second gate electrodes. The interconnection layer is properly buried when forming the interconnection layer for electric connection to the first source/drain region on the semiconductor substrate to fill the contact hole. As a result, reliability of the semiconductor device effectively increases.

In the method of manufacturing the semiconductor device according to still another aspect of the present invention, the second insulating film may be a silicon oxide film.

In the method of manufacturing the semiconductor device according to still another aspect of the present invention, impurities may include at least one of boron and phosphorus.

In the method of manufacturing the semiconductor device according to still another aspect of the present invention, a step of forming an insulating film not including impurities on the entire surface of the semiconductor substrate is further provided before the step of forming the insulating film including impurities on the entire surface of the semiconductor substrate, and a step of performing a thermal treatment on the insulating film including impurities is further provided.

According to such a manufacturing method, formation of the silicon oxide film prevents diffusion of impurities into the semiconductor substrate, so that a transistor is not adversely affected.

In the method of manufacturing the semiconductor device according to still another aspect of the present invention, the insulating film not including the impurities may be a silicon oxide film having a thickness of at most 300 Å.

In the method of manufacturing the semiconductor device according to still another aspect of the present invention, the insulating film not including the impurities is a silicon nitride film having a thickness of at most 300 Å.

According to such a manufacturing method, the silicon oxide film prevents oxidation of the semiconductor substrate, so that planarization by the thermal treatment can be performed in an oxidation atmosphere. As a result, good planarization is achieved as compared with the case of planarization by the thermal treatment in a non-oxidation atmosphere.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A and 33B are cross sectional views showing structures in conjunction with a method of manufacturing a semiconductor device according to the fourth embodiment of the present invention.

FIGS. 58A, 58B, 59A, 59B, 60A, 60B, 61A, 61B, 62A, 62B, 63A, 63B, 64A, 64B, 65A, 65B, 66A and 66B are cross sectional views showing structures in conjunction with an SAC process for a conventional memory device.

DESCRIPTION OF THE PREFERRED EMBODIMENTS

Embodiments of the present invention will now be described with reference to the drawings. In the schematic cross sectional views shown in conjunction with the embodiments, FIGS. 1A to 47A show memory device formation regions, and FIGS. 1B to 47B show logic device formation regions.

First Embodiment

Now, referring to FIGS. 1A to 9A and FIGS. 1B to 9B, a method of manufacturing a mixed device according to the first embodiment will be described.

Figure 1A:
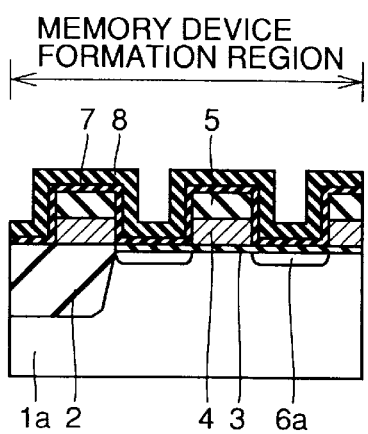
FIGS. 1A, 1B, 2A, 2B, 3A, 3B, 4A, 4B, 5A, 5B, 6A, 6B, 7A, 7B, 8A, 8B, 9A and 9B are cross sectional views showing structures in conjunction with a method of manufacturing a semiconductor device according to the first embodiment of the present invention.
Figure 1B:
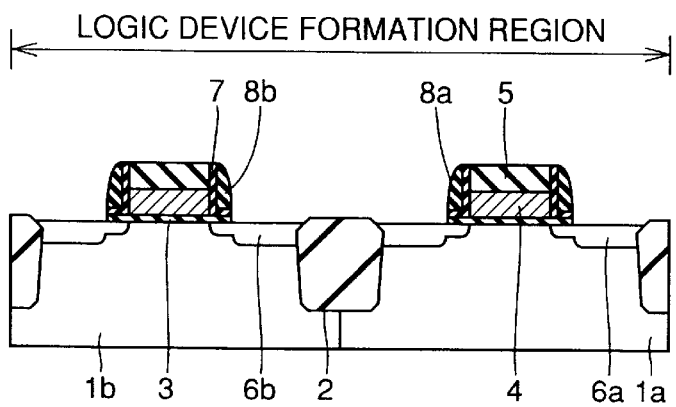
Figure 2A:
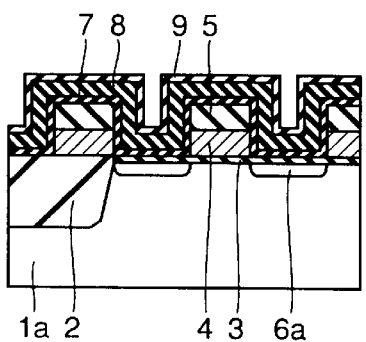
Figure 2B:
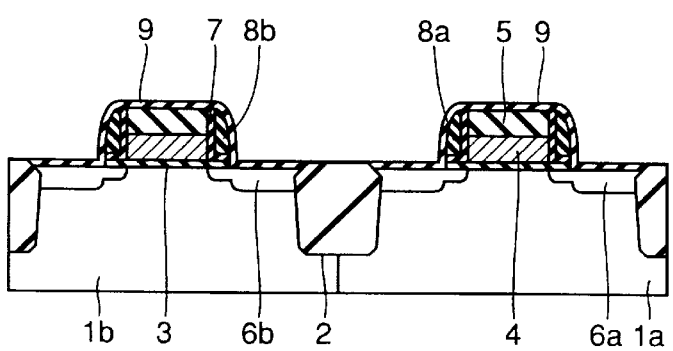
Figure 3A:
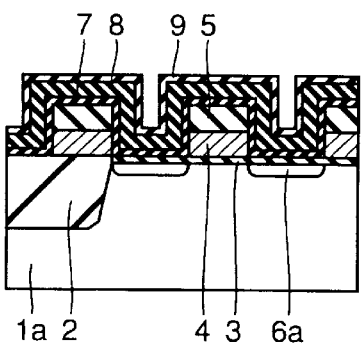
Figure 3B:
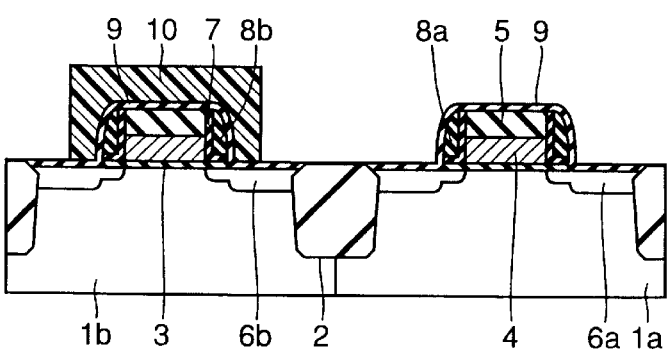
Figure 4A:
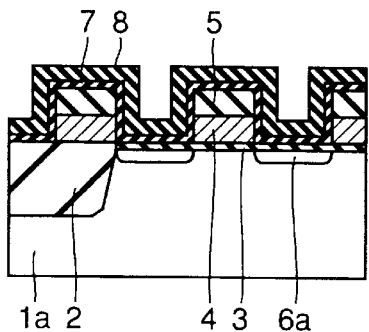
Figure 4B:
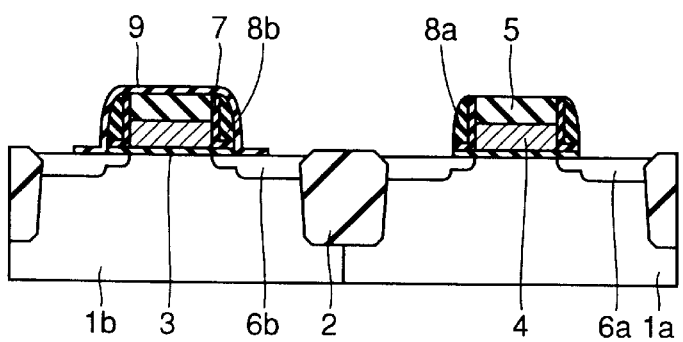

A method of manufacturing the structure shown in FIGS. 1A and 1B is the same as the conventional method of manufacturing the memory device shown in FIGS. 58A to 61A and FIGS. 58B to 61B. As shown in FIGS. 2A and 2B, a silicon oxide film 9 as a salicide protection film is formed on the entire surface of the semiconductor substrate. A resist film is formed to cover the entire surface of the semiconductor substrate. Photolithography is performed on the resist film while covering a portion where silicon oxide film 9 is to be left in the logic device formation region. Then, the resist film in the portion other than that where silicon oxide film 9 is to be left in the logic device formation region is etched. This results in a structure shown in FIGS. 3A and 3B. Wet isotropic etching is performed on silicon oxide film 9. The process removes silicon oxide film 9 not covered with resist film 10. The wet etching does not reduce a thickness of silicon nitride film 8 in the memory device formation region, but only silicon oxide film 9 is etched. As shown in FIGS. 4A and 4B, resist film 10 is removed.

Figure 5A:
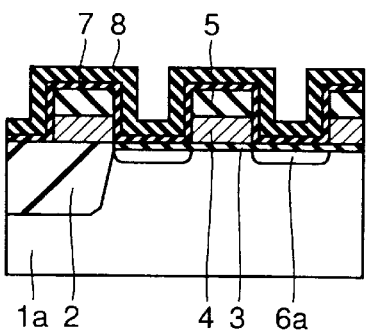
Figure 5B:
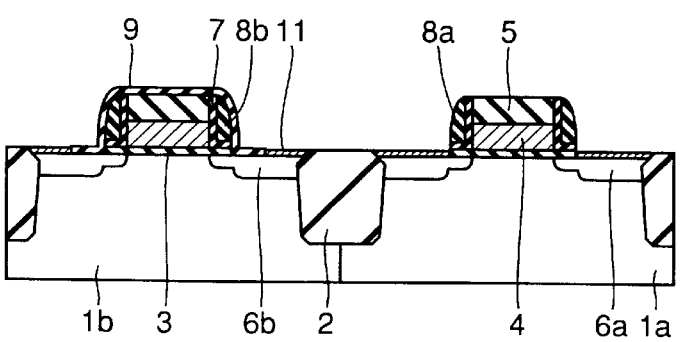
Figure 6A:
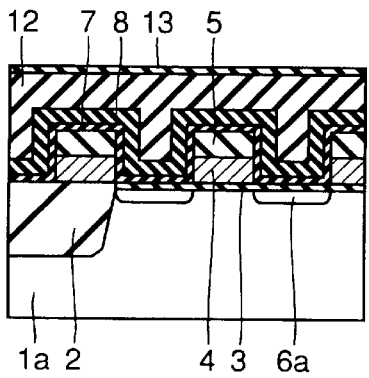
Figure 6B:
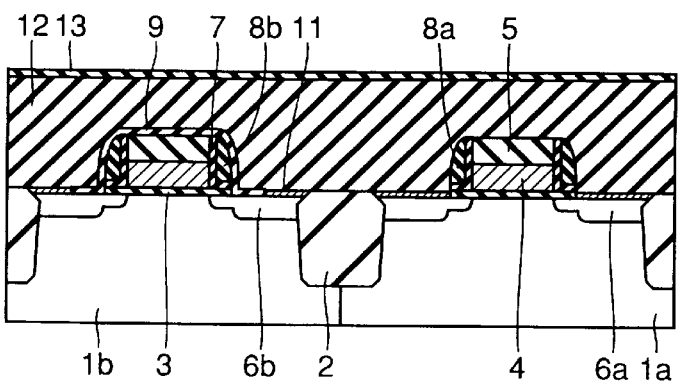
Figure 7A:
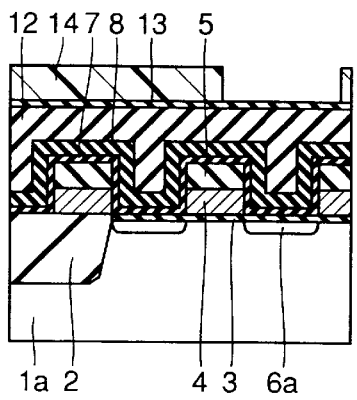
Figure 7B:
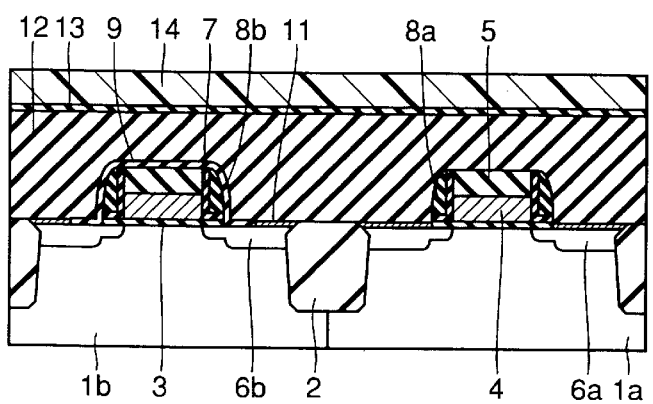
Figure 8A:
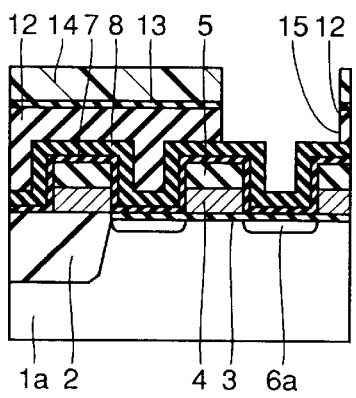
Figure 8B:
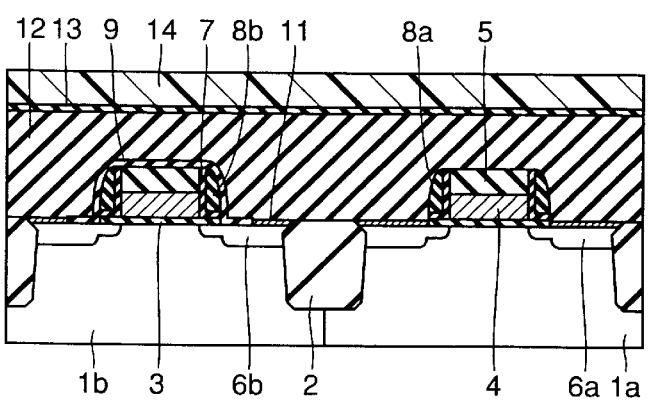
Figure 9A:
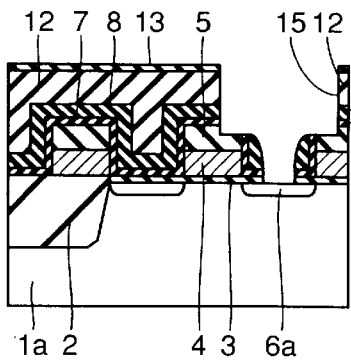
Figure 9B:
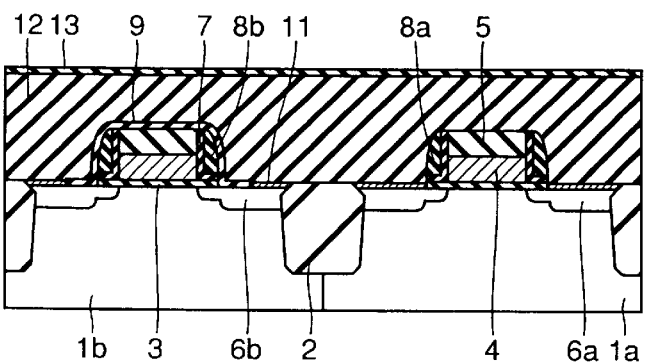
Figure 10A:
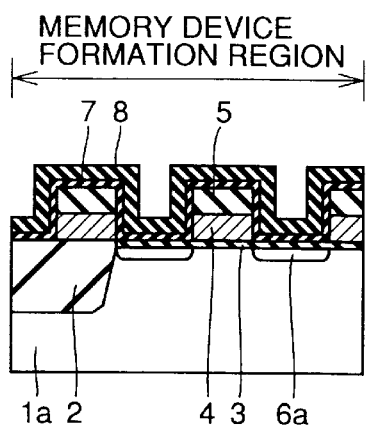
FIGS. 10A, 10B, 11A, 11B, 12A, 12B, 13A, 13B, 14A, 14B, 15A, 15B, 16A and 16B are cross sectional views showing structures in conjunction with a method of manufacturing a semiconductor device according to the second embodiment of present invention.
Figure 10B:
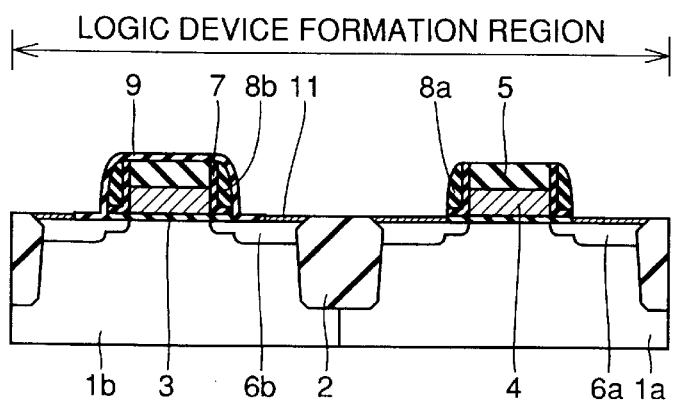

Referring to FIGS. 5A and 5B, a refractory metal silicide film 11 is formed in an active region where the semiconductor substrate is exposed in the logic device formation region. Refractory metal silicide film 11 is for example formed of a cobalt silicide film or titanium silicide film. Then, a BPSG film 12 is formed to cover the entire surface of the semiconductor substrate. The surface of BPSG film 12 is planarized by a thermal treatment or CMP process. Then, as shown in FIGS. 6A and 6B, a silicon oxide film 13 is formed on BPSG film 12. A resist film is formed to cover the entire surface of the semiconductor substrate. Thereafter, photolithography is performed on the resist film to pattern a self alignment contact opening in the memory device formation region. Resist film 14 is etched. This results in a structure shown in FIGS. 7A and 7B. As shown in FIGS. 8A and 8B, silicon oxide film 13 and BPSG film 12 are sequentially subjected to anisotropic etching. Then, resist film 14 is removed. Referring to FIGS. 9A and 9B, silicon nitride film 8, silicon oxide film 7 and gate insulating film 3 are subjected to anisotropic etching in a self-aligning manner to leave a protection insulating film on the upper surfaces and side walls of respective gate electrodes using silicon oxide film 13 and BPSG film 12 as masks. Thus, a self alignment contact opening 15 leading to a source/drain region 6a is formed. Self alignment contact opening 15 is used as a contact plug for connecting the source/drain region and a bit line, or as a hole in which a contact plug or the like for connecting the source/drain region and a capacitor is formed.

According to the method of manufacturing the mixed device in the first embodiment, in the steps shown in FIGS. 3A, 3B, 4A and 4B, silicon oxide film 9 is etched by wet isotropic etching. Accordingly, silicon oxide film 9 in the memory device formation region is completely removed. Thus, silicon oxide film 9 is not left on an inner wall of a recess formed by silicon nitride film 8. As compared with the above described method of manufacturing the semiconductor device in the background-of-art section, an aspect ratio of the SAC opening is small. Therefore, an interconnection layer is properly buried in the SAC. Consequently, good electric connection between the interconnection layer formed after formation of SAC opening and source/drain region 6a on the semiconductor substrate is achieved. As a result, reliability of the semiconductor device increases.

In addition, in the conventional method of manufacturing the mixed device, a residue of silicon oxide film 109 reduces a distance between inner walls of the recess formed by silicon nitride film 108, thereby increasing the aspect ratio of the recess formed by silicon nitride film 108 between the gate electrodes. As a result, a cavity is formed in BPSG film 112 in the recess formed by silicon nitride film 108. This prevents transistors from being surely insulated, so that reliability of the semiconductor device disadvantageously decreases. However, according to the method of manufacturing the mixed device of the first embodiment, silicon oxide film 9 is not left on the inner wall of the recess formed by silicon nitride film 8, and no cavity is formed in BPSG film 12. Insulation between transistors is thereby ensured, and reliability of the semiconductor device increases.

Further, in the steps shown in FIGS. 3A, 3B, 4A and 4B, silicon oxide film 9 is subjected to wet isotropic etching. The wet etching does not reduce the thickness of silicon nitride film 8 in the memory device formation region, but only silicon oxide film 9 is etched. As reduction in the thickness of silicon nitride film 8 on the gate electrode or removal of silicon nitride film 8 is prevented, the problem associated with a short-circuit of gate electrode 4 and other interconnection layers caused by exposure of gate electrode 4 is eliminated. As a result, reliability of the semiconductor device increases.

Second Embodiment

Referring to FIGS. 10A to 16A and FIGS. 10B to 16B, a method of manufacturing a mixed device according to the second embodiment will be described. In the second embodiment, the method of manufacturing the structure shown in FIGS. 10A and 10B includes steps similar to those of the method of manufacturing the mixed device of the first embodiment shown in FIGS. 5A and 5B. As shown in FIGS. 11A and 11B, in the manufacturing method of the second embodiment, a thin silicon oxide film 16, such as a TEOS oxide film represented by a chemical formula $Si(OC_2H_5)_4$ and having a thickness of at most 300 Å, is formed to cover the entire surface of the semiconductor substrate. A BPSG film 12 is formed on silicon oxide film 16. BPSG film 12 is planarized for example by a thermal treatment or CMP. Then, silicon oxide film 13 is formed on BPSG film 12. This results in a structure shown in FIGS. 12A and 12B.

Figure 14A:
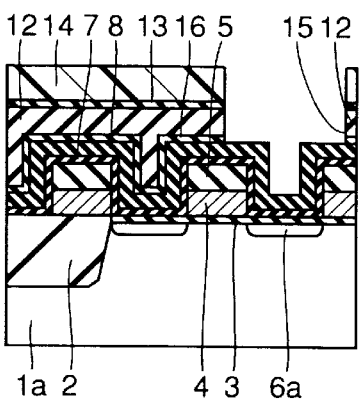
Figure 14B:
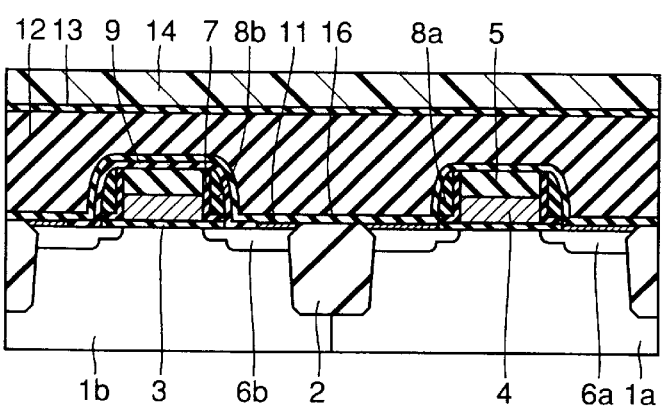
Figure 15A:
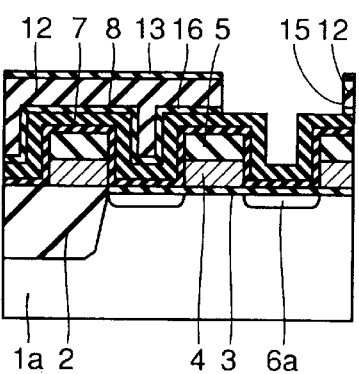
Figure 15B:
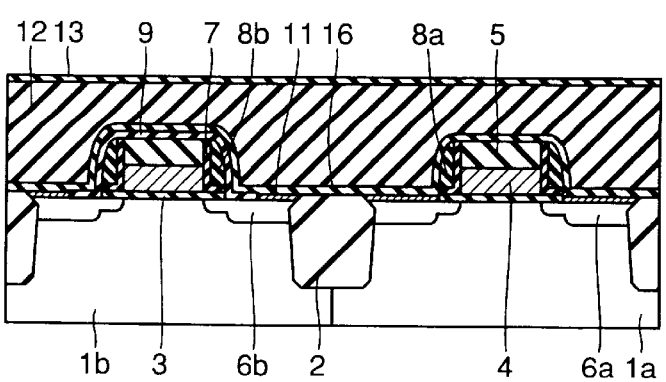
Figure 16A:
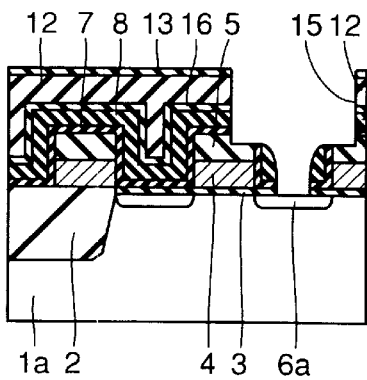
Figure 16B:
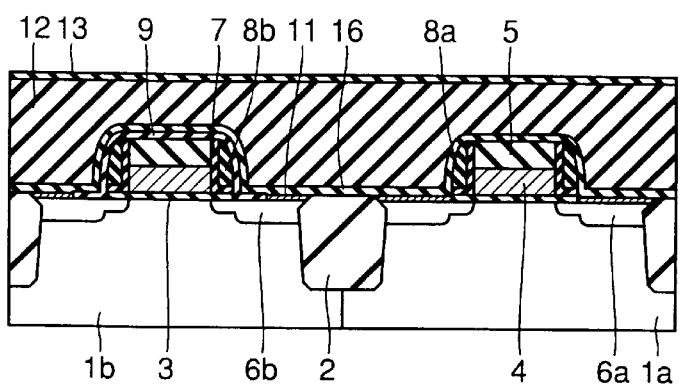
Figure 17A:
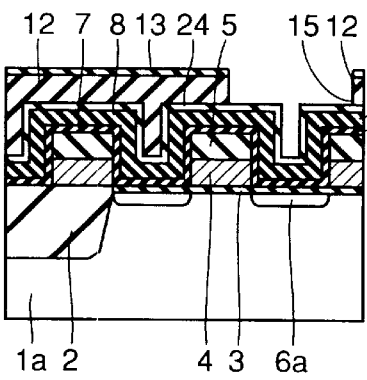
FIGS. 17A, 17B, 18A and 18B are cross sectional views showing structures in conjunction with a method of manufacturing a semiconductor device according to the third embodiment of the present invention.
Figure 17B:
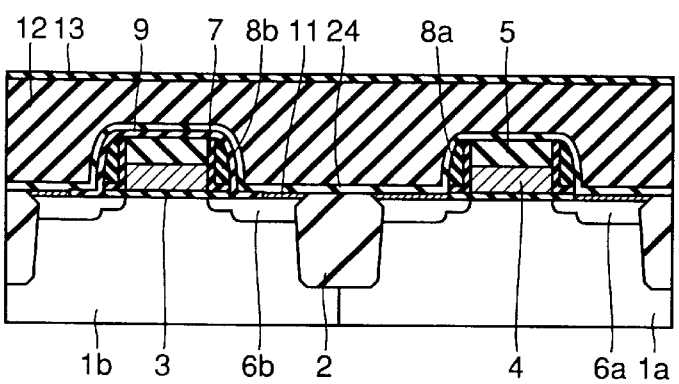

A resist film 14 is formed to cover the entire surface of the semiconductor substrate. The resist film is subjected to photolithography for pattering a self alignment contact opening in the memory device formation region. The resist film in the self alignment contact opening is etched. Resist film 14 is thereby formed. This results in a structure shown in FIGS. 13A and 13B. As shown in FIGS. 14A and 14B, silicon oxide film 13, BPSG film 12 and thin silicon oxide film 16 are sequentially subjected to anisotropic etching. As shown in FIGS. 15A and 15B, resist film 14 is removed. Further, silicon nitride film 8, silicon oxide film 7 and gate insulating film 3 are subjected to anisotropic etching in a self-aligning manner to leave a protection insulating film on the upper surfaces and side walls of the gate electrodes using silicon oxide film 13, BPSG film 12 and thin silicon oxide film 16 as masks. The above described steps form a self alignment contact opening 15 as shown in FIGS. 16A and 16B.

In the method of manufacturing the mixed device of the second embodiment, as in the method of manufacturing the mixed device of the first embodiment, silicon oxide film 9 as a salicide protection film is formed by wet isotropic etching. Thus, an effect similar to that obtained by the method of manufacturing the mixed device of the first embodiment is produced.

In the method of manufacturing the mixed device of the first embodiment, BPSG film 12 is formed immediately on refractory metal silicide film 11 in the logic device formation region. Accordingly, when a thermal treatment is performed for subsequent planarization, boron or phosphorus may be diffused into the semiconductor substrate through refractory metal silicide film, thereby causing a leakage current to the transistor.

However, according to the method of manufacturing the mixed device of the second embodiment, thin silicon oxide film 16 is formed between refractory metal silicide film 11 and BPSG film 12. Thus, even when the thermal treatment is performed for planarization of BPSG film 12, silicon oxide film 16 prevents diffusion of boron or phosphorus into the semiconductor substrate. Accordingly, the transistor is not adversely affected by the impurities of BPSG film 12.

Third Embodiment

Referring to FIGS. 17A, 18A, 17B and 18B, a method of manufacturing a mixed device of the third embodiment will be described. The method of manufacturing the mixed device of the third embodiment is performed by steps similar to those of the method of manufacturing the mixed device of the second embodiment. The method of manufacturing the mixed device of the third embodiment is different from the method of manufacturing the mixed device of the second embodiment in that a thin silicon nitride film 24 having a thickness of at most 300 Å is formed in place of thin silicon oxide film 16 formed in the step shown in FIGS. 11A and 11B.

Figure 11A:
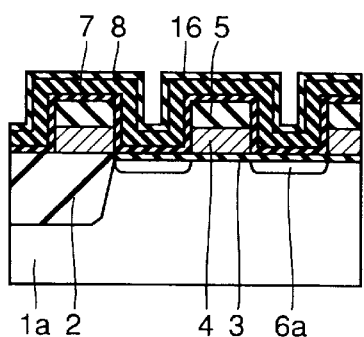
Figure 11B:
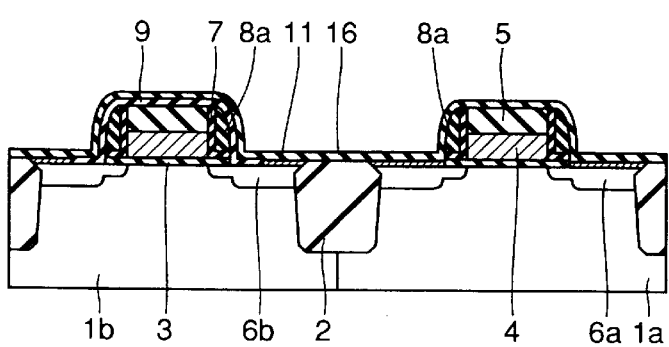
Figure 12A:
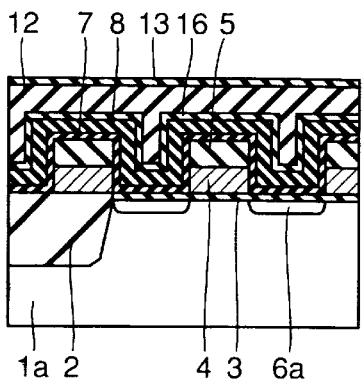
Figure 12B:
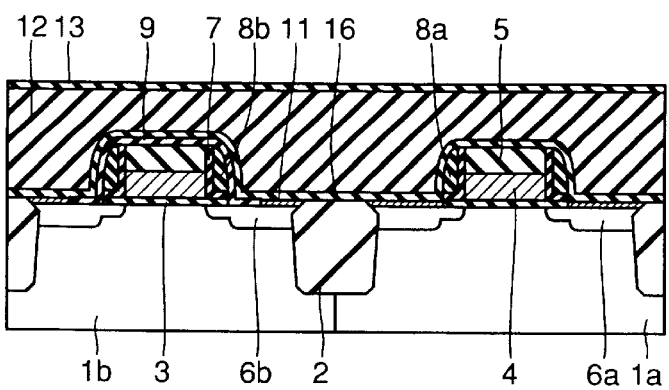
Figure 13A:
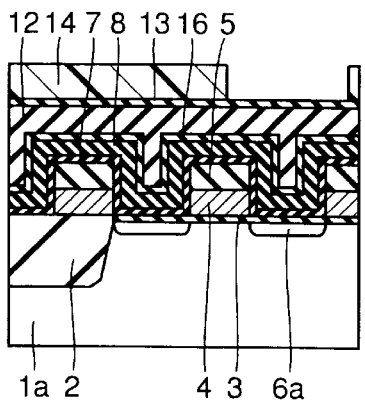
Figure 13B:
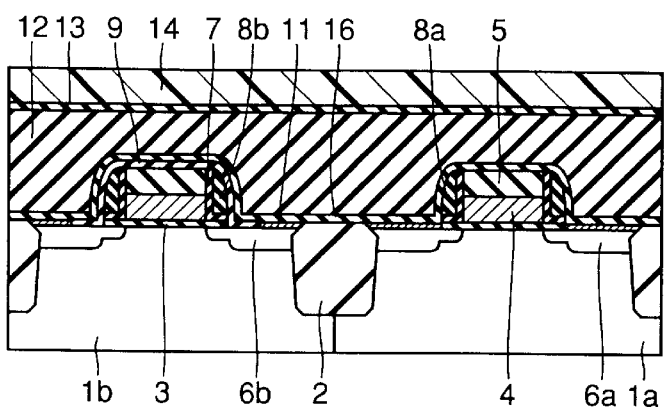

More specifically, after silicon nitride film 24 is formed in the structure shown in FIGS. 11A and 11B, as in the step performed in the second embodiment, a BPSG film 12 is formed on silicon nitride film 24. Thereafter, the surface of BPSG film 12 is planarized by a thermal treatment or CMP. Successively, a silicon oxide film 13 is formed on BPSG film 12. A resist film is applied on BPSG film 12. Then, resist film 14 is subjected to photolithography for pattering a self alignment contact opening in the memory device formation region.

Figure 18A:
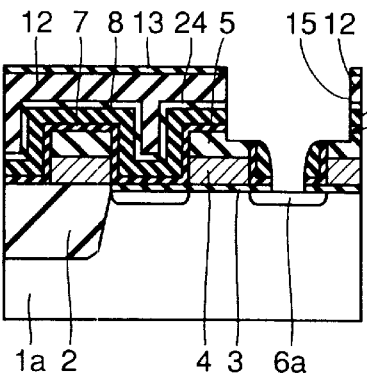
Figure 18B:
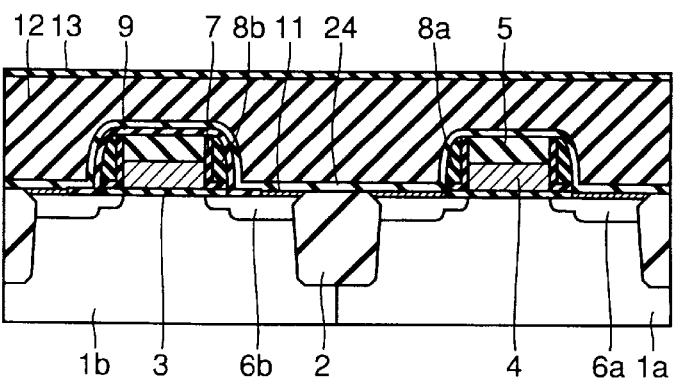
Figure 19A:
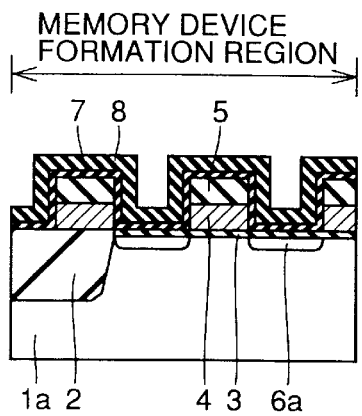
Figure 19B:
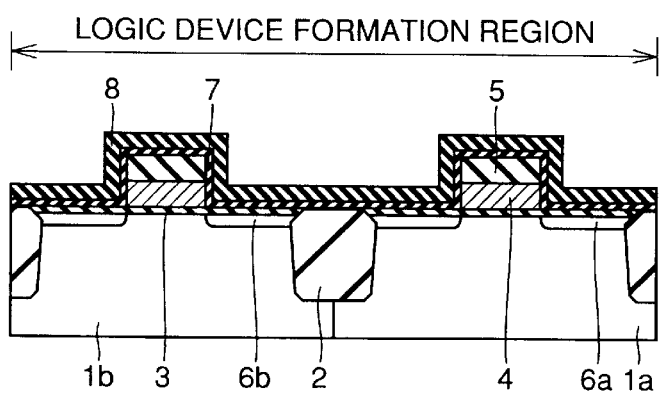

Silicon oxide film 13 and BPSG film 12 are sequentially subjected to anisotropic etching using resist film 14 as a mask. Resist film 14 is then removed. This results in a structure shown in FIGS. 17A and 17B. As shown in FIGS. 18A and 18B, silicon nitride film 8, 24 and silicon oxide film 7 are sequentially subjected to anisotropic etching using silicon oxide film 13 and BPSG film 12 as masks. The above described steps form a self alignment contact opening 15. It is noted that, in the above described steps, silicon oxide film 13 may be reduced or removed.

In the method of manufacturing the mixed device of the third embodiment, as in the method of manufacturing of the mixed device of the first embodiment, silicon oxide film 9 as a salicide protection film is formed by wet isotropic etching, so that an effect similar to that of the method of manufacturing the mixed device of the first embodiment is produced.

In the method of manufacturing the mixed device according to the first and second embodiments, the semiconductor substrate and refractory metal silicide film 11 may be oxidized, and therefore planarization of BPSG film 12 by the thermal treatment cannot be performed in an oxidation atmosphere including hydrogen and oxygen. Thus, planarization with use of the thermal treatment would be possible only in an atmosphere in which the semiconductor substrate and refractory metal silicide film 11 are not oxidized, for example, in a nitrogen atmosphere.

According to the method of manufacturing the mixed device of the third embodiment, however, the thin silicon nitride film prevents oxidation of the semiconductor substrate and refractory metal silicide film 11, thereby enabling planarization by the thermal treatment in the oxidation atmosphere. As a result, in the method of manufacturing the mixed device of the present embodiment, good planarization of the surface of BPSG film 12 is achieved as compared with the case where planarization is performed by the thermal treatment in the non-oxidation atmosphere such as the nitrogen atmosphere.

Fourth Embodiment

Figure 20A:
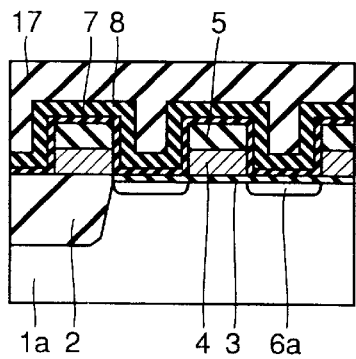
Figure 20B:
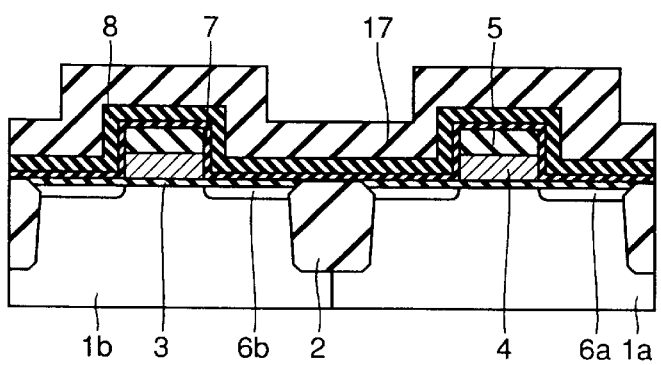
Figure 21A:
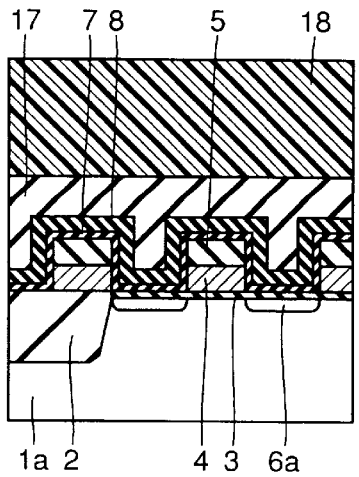
Figure 21B:
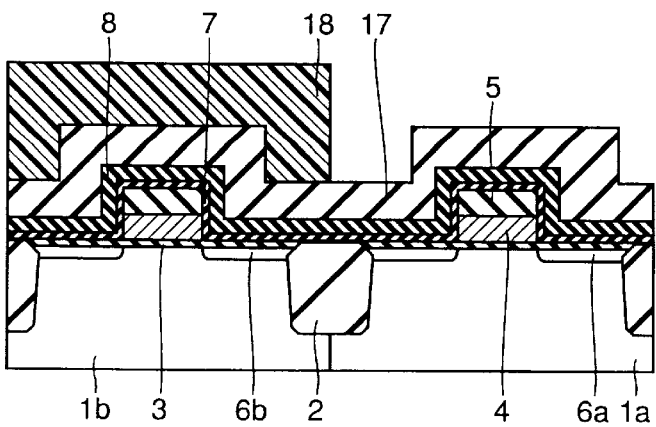

Now, referring to FIGS. 19A to 33A and FIGS. 19B to 33B, the fourth embodiment will be described. The method of manufacturing a structure shown in FIGS. 19A and 19B includes steps similar to those of the method of manufacturing the structure shown FIG. 59A and 59B. Referring to FIGS. 20A and 20B, a BPSG film 17 is formed to cover the entire surface of the semiconductor substrate. With provision of silicon nitride film 8 under BPSG film 17, planarization by a thermal treatment in an oxidation atmosphere is possible. BPSG film 17 is planarized in the memory device formation region.

Then, a resist film is formed to cover the entire surface of the semiconductor substrate. Thereafter, a logic device formation region is subjected to photolithography to form an n type transistor region. The resist film in the region other than in the n type transistor region is etched in the logic device formation region. A resist film 18 is thereby formed. This results in a structure shown in FIGS. 21A and 21B.

Figure 22A:
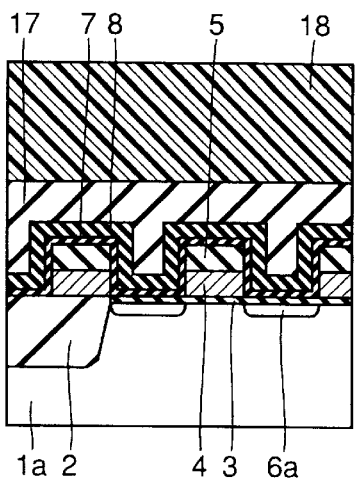
Figure 22B:
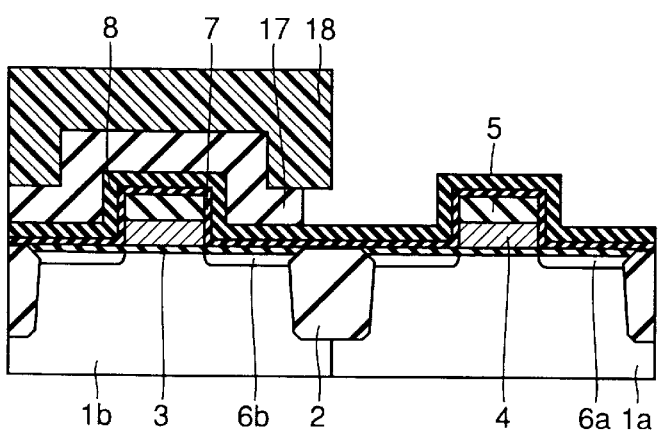

Thereafter, as shown in FIGS. 22A and 22B, BPSG film 17 is subjected to wet isotropic etching using resist film 18 as a mask.

Figure 23A:
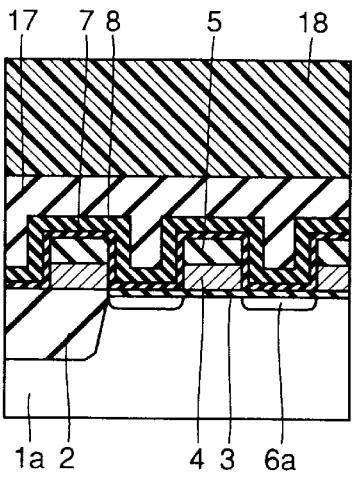
Figure 23B:
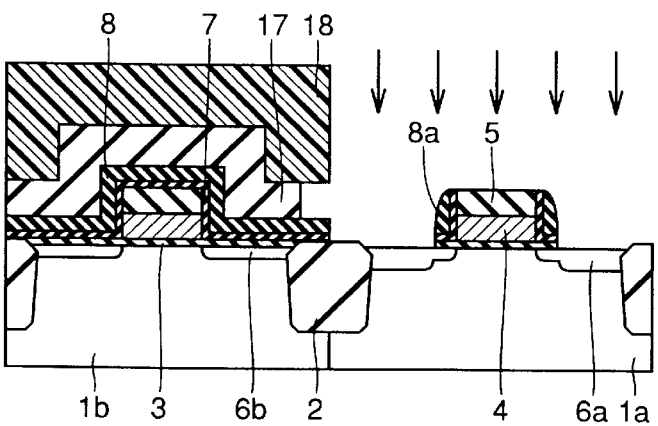

By anisotropic etching of silicon nitride film 8, silicon oxide film 7 and gate insulating film 3 using resist film 18 as a mask, a sidewall nitride film 8a of a transistor is formed. Then, as shown in FIGS. 23A and 23B, n type impurities are implanted to the n type transistor region of the logic device formation region using resist film 18 as a mask. As a result, source/drain region 6a comes to have an LDD structure.

Figure 24A:
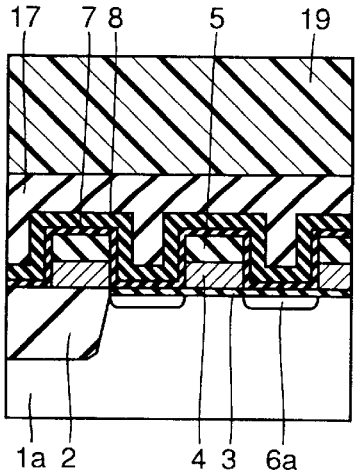
Figure 24B:
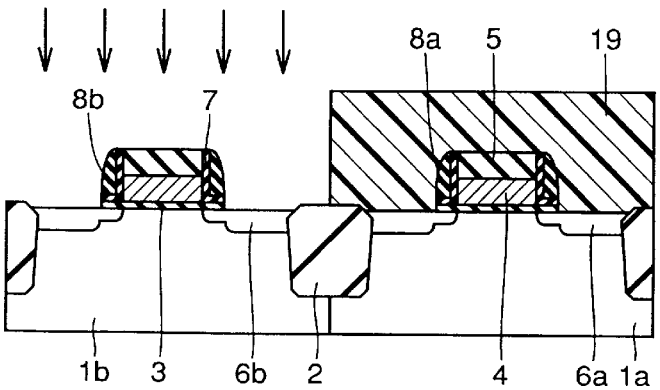
Figure 25A:
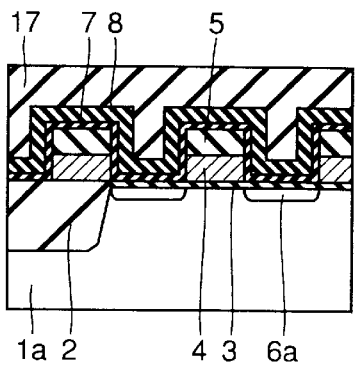
Figure 25B:
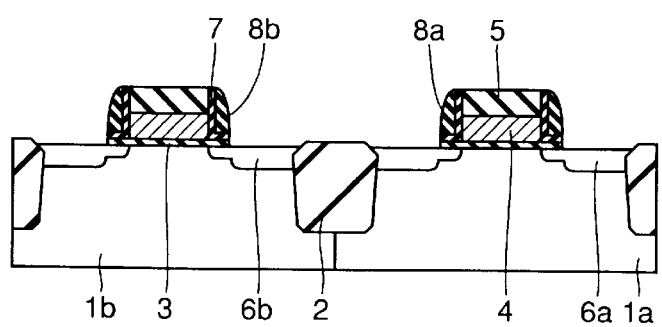
Figure 26A:
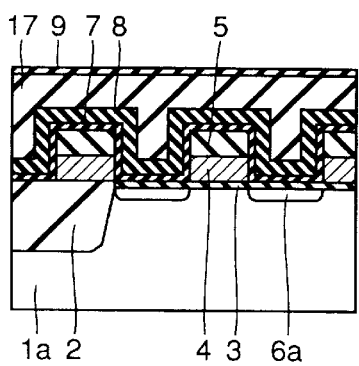
Figure 26B:
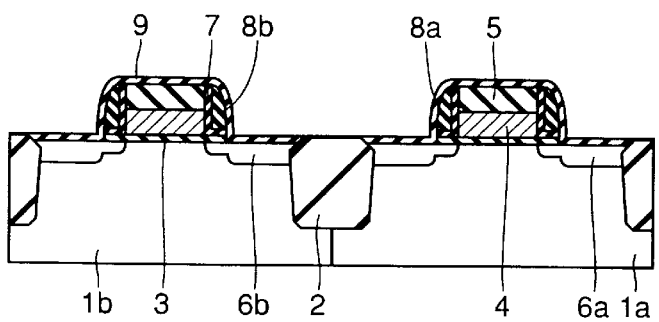

Resist film 18 is then removed. A resist film is formed to cover the entire surface of the semiconductor substrate. Then, the logic device formation region is subjected to photolithography for forming a p type transistor region. Further, BPSG film 17, which has been formed on the p type transistor region of the logic device formation region, is etched. Successively, silicon nitride film 8, silicon oxide film 7 and gate insulating film 3 are subjected to anisotropic etching. This forms a sidewall nitride film 8b of the transistor. Thereafter, as shown in FIGS. 24A and 24B, p type impurities of a conductivity type which is opposite to that used in the step shown in FIGS. 23A and 23B are implanted. Thus, source/drain region 6b comes to have the LDD structure. Next, as shown in FIGS. 25A and 25B, resist film 19 is removed. Referring to FIGS. 26A and 26B, a silicon oxide film 9 as a salicide protection film is formed to cover the entire surface of the semiconductor substrate.

Figure 27A:
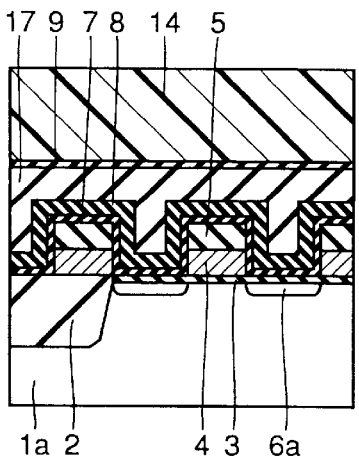
Figure 27B:
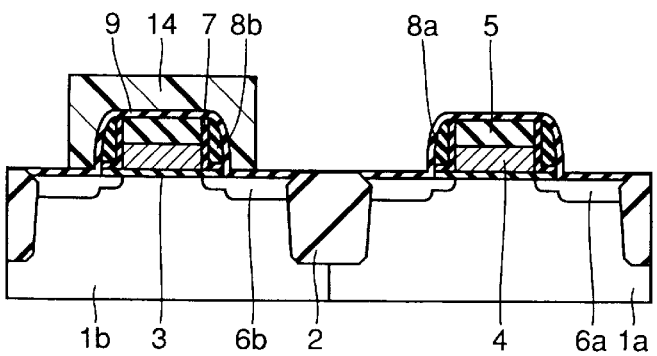

Referring to FIGS. 27A and 27B, a resist film is formed to cover the entire surface of the semiconductor substrate. Thereafter, photolithography is performed such that the resist film is left in the portion where silicon oxide film 9 is to be left in the logic device formation region. Then, the resist film in the portion other than where silicon oxide film 9 of the logic device formation region is to be left is etched. Referring to FIGS. 28A and 28B, silicon oxide film 9 is subjected to anisotropic etching or isotropic etching. Thereafter, resist film 14 is removed. As shown in FIGS. 29A and 29B, a refractory metal silicide film 11 is formed in an active region exposing the semiconductor substrate.

Figure 31A:
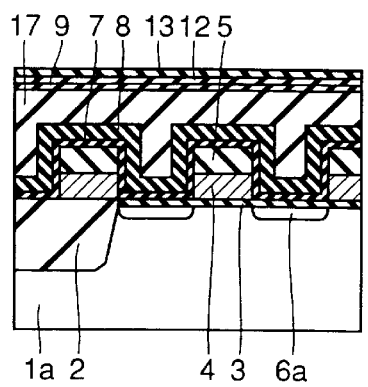
Figure 31B:
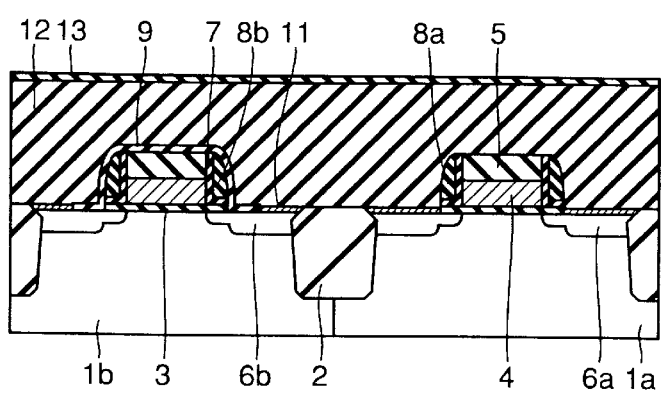
Figure 32A:
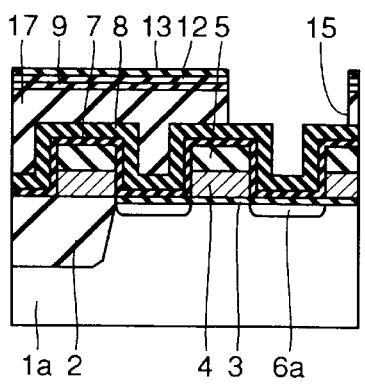
Figure 32B:
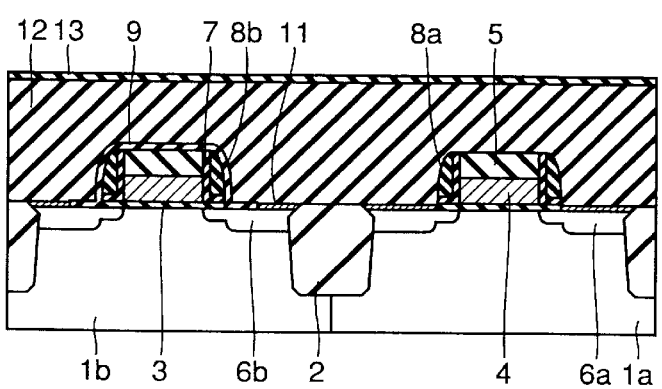
Figure 33A:
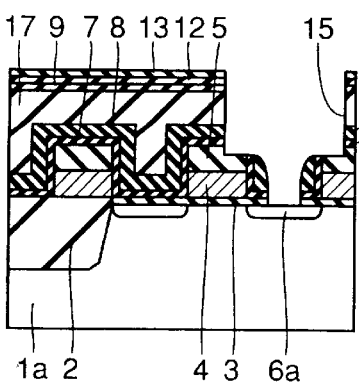
Figure 33B:
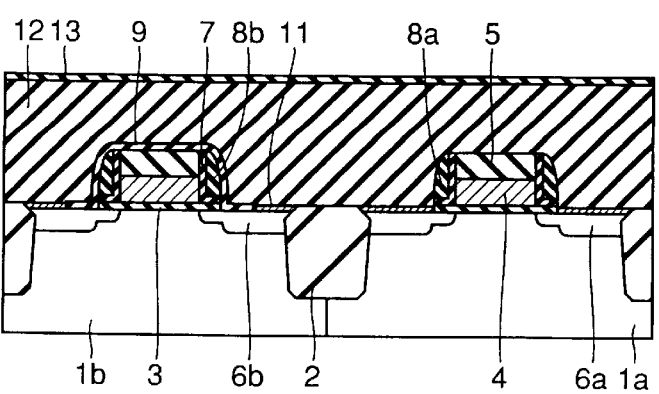

Further, a BPSG film 12 is formed to cover the entire surface of the semiconductor substrate. Planarization is performed by a thermal treatment or CMP. This results in a structure shown in FIGS. 30A and 30B. Referring to FIG. 31, a silicon oxide film 13 is formed on BPSG film 12. If an interlayer insulating film such as BPSG film 12 of the logic device formation region needs not be planarized, only silicon oxide film 13 is formed to cover the entire surface of the semiconductor substrate. It is noted that, although planarization of BPSG film 12 is performed by CMP in the structure shown in FIG. 31, if the thermal treatment is performed (not shown), there would be some step between the memory device formation region and the logic device formation region due to a difference in thickness of the interlayer insulating films.

While not shown in the drawings, a resist film is formed on a silicon oxide film. Then, photolithography is performed for pattering the resist film such that an SAC opening is formed in the memory device formation region. Then, silicon oxide film 13, BPSG film 12, silicon oxide film 9 and BPSG film 17 are sequentially etched using the resist film as a mask. The resist film is removed. This results in a structure shown in FIG. 32. Thereafter, silicon nitride film 8 and silicon oxide film 7 are sequentially subjected to isotropic etching using silicon oxide film 13, BPSG film 12, silicon oxide film 9 and BPSG film 19 as masks. Accordingly, as shown in FIG. 33, an SAC opening 15 is formed to leave a protection insulating film on the upper surfaces and side walls of the gate electrode.

In the fourth embodiment, the memory device formation region is planarized by BPSG film 17 before silicon oxide film 9 as a salicide protection film, is formed in the memory device formation region. Further, in the step shown in FIGS. 27A and 27B, there is resist film 14 in the memory device formation region when the salicide protection film is formed, and silicon oxide film 9 as a salicide protection film, is left on the entire surface of the memory device formation region. When forming the SAC opening, films are sequentially etched, so that anisotropic etching is performed in forming the SAC. As BPSG film 12 includes impurities, also in such steps, etching is performed while not leaving etching residue on an inner wall of the recess formed by silicon nitride film 8. Therefore, silicon oxide film 9, as a salicide protection film, produces an effect similar to that obtained by the method of manufacturing the mixed device of the first embodiment.

Further, planarization of BPSG film 17 by the thermal treatment is performed in the oxidation atmosphere using silicon nitride film 8 as a sidewall nitride film of the transistor, as an oxidation preventing film for the semiconductor substrate in the step shown in FIGS. 20A and 20B. Thus, the number of forming silicon nitride films decreases as compared with the method of manufacturing the mixed device of the third embodiment. As a result, corresponding reduction in the number of steps of manufacturing the mixed device is achieved. In addition, formation of BPSG film 17 on silicon nitride film 8 prevents diffusion of boron or phosphorus into the semiconductor substrate, so that the transistor is not adversely affected by BPSG film 17.

Fifth Embodiment

Referring to FIGS. 34A to 41A and 34B to 41B, the fifth embodiment will be described.

Figure 34A:
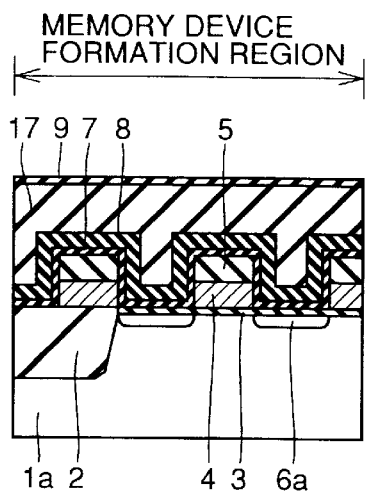
FIGS. 34A, 34B, 35A, 35B, 36A, 36B, 37A, 37B, 38A, 38B, 39A, 39B, 40A, 40B, 41A and 41B are cross sectional views showing structures in conjunction with a method of manufacturing a semiconductor device according to the fifth embodiment of the present invention.
Figure 34B:
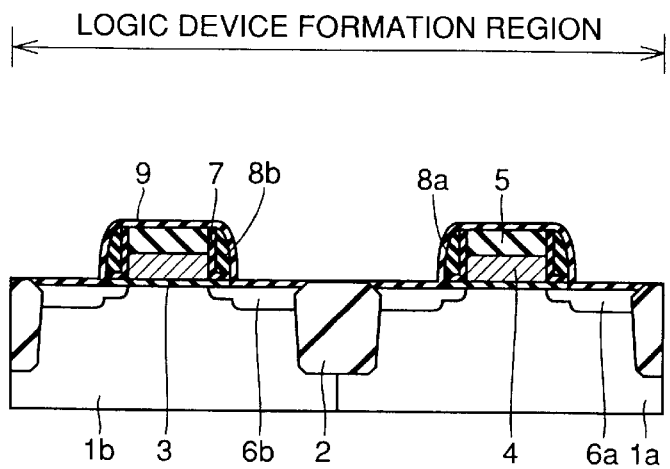
Figure 35A:
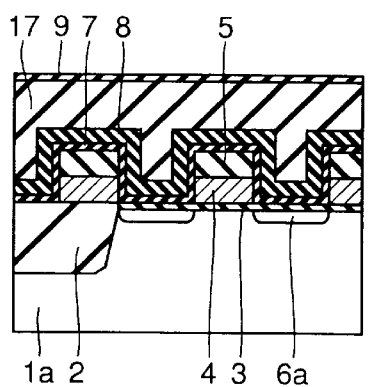
Figure 35B:
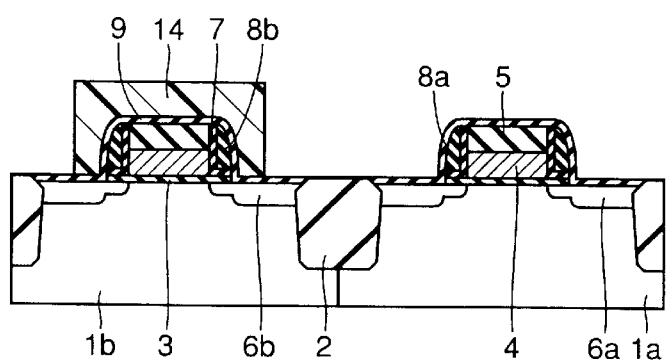

In the method of manufacturing the mixed device of the fifth embodiment, the structure shown in FIGS. 34A and 34B is manufactured by steps similar to those of the method of manufacturing the structure shown in FIGS. 26A and 26B of the fourth embodiment. In the method of manufacturing the mixed device of the present embodiment, as shown in FIGS. 35A and 35B, photolithography is performed such that a resist film is left only in the portion where silicon oxide film 9 as a salicide protection film is to be left in the logic device formation region. Then, etching the resist film in the portion other than where silicon oxide film 9 is to be left forms a resist film 14. In this state, the memory device formation region is not covered with resist film 14.

Figure 36A:
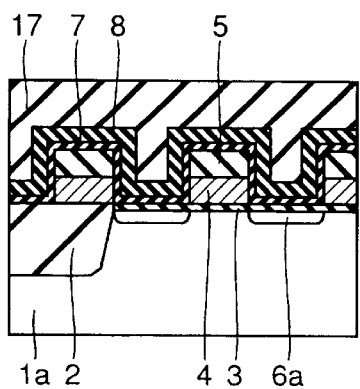
Figure 36B:
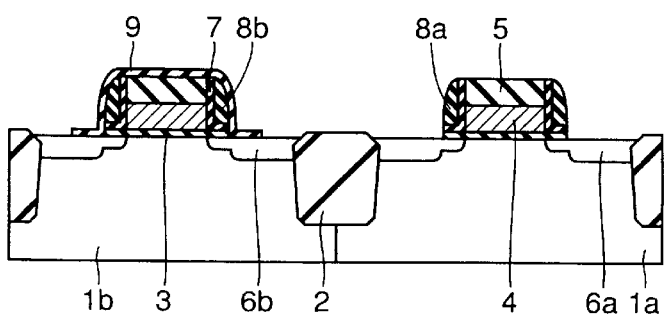
Figure 37A:
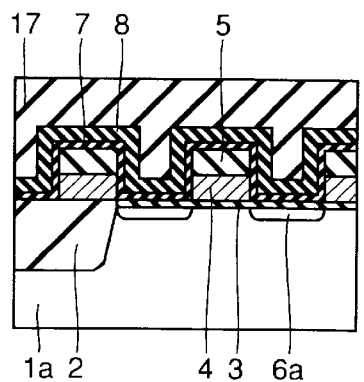
Figure 37B:
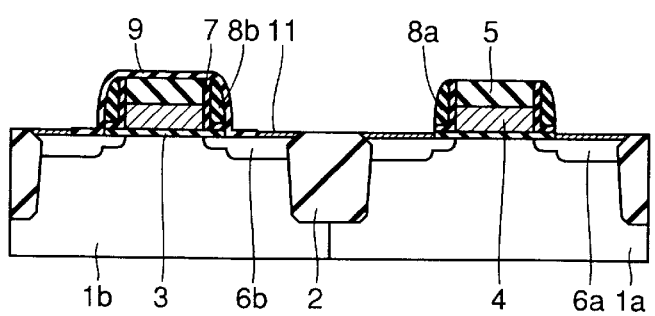
Figure 38A:
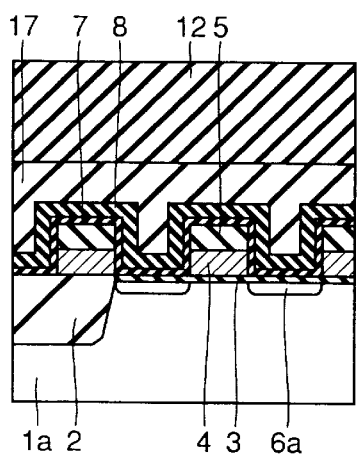
Figure 38B:
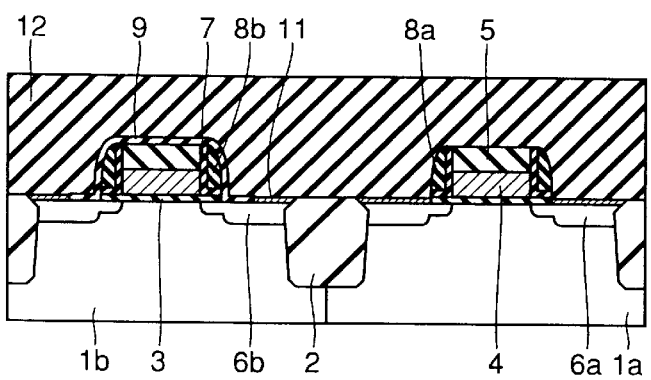
Figure 39A:
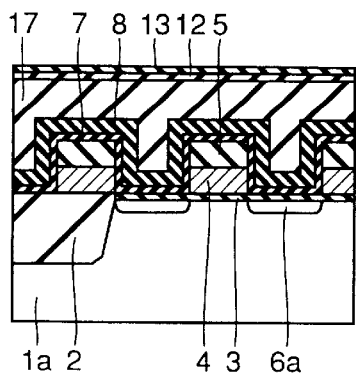
Figure 39B:
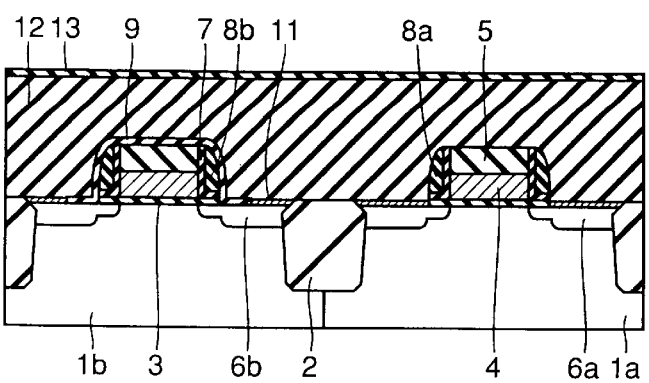
Figure 40A:
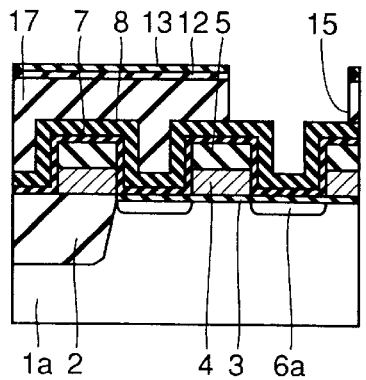
Figure 40B:
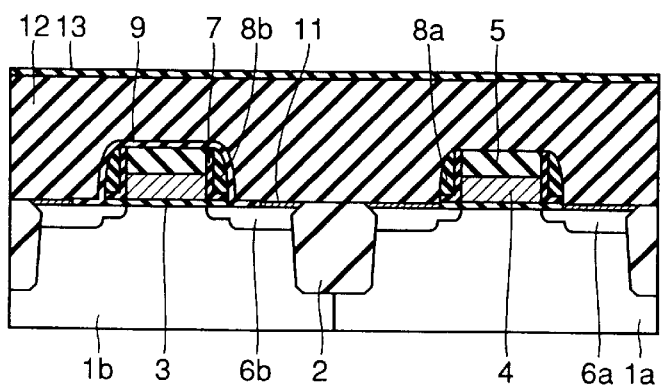

Then, silicon oxide film 9 is subjected to anisotropic etching or isotropic etching using resist film 14 as a mask. Referring to FIGS. 36A and 36B, resist film 14 is then removed. As shown in FIGS. 37A and 37B, refractory metal silicide film 11 is formed on an active region exposing the semiconductor substrate. A BPSG film 12 is formed. BPSG film 12 is planarized for example by a thermal treatment or CMP. This results in a structure shown in FIGS. 38A and 38B. Referring to FIGS. 39A and 39B, a silicon oxide film 13 is formed on BPSG film 12. If the logic device formation region needs not be planarized, BPSG film 12 is not formed and only silicon oxide film 13 may be formed to cover the entire surface of the semiconductor substrate.

It is noted that, in the structures shown in FIGS. 38A, 38B, 39A and 39B, the surface of BPSG film 12 is planarized by CMP. On the other hand, if the planarization is performed by the thermal treatment, there would be some step between the memory device formation region and the logic device formation region due to a difference in thickness of the interlayer insulating films.

Figure 41A:
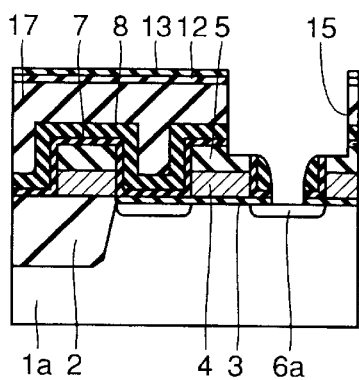
Figure 41B:
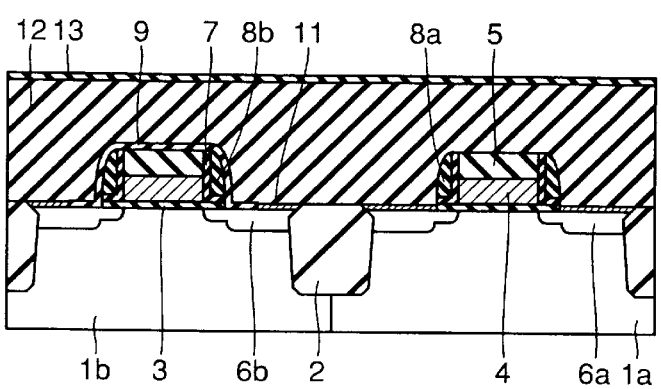
Figure 42A:
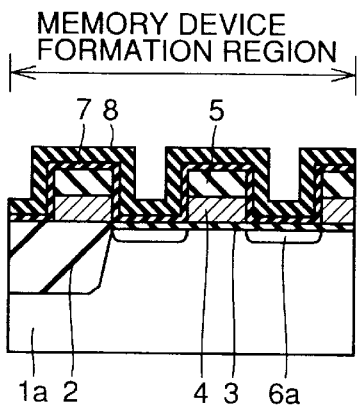
FIGS. 42A, 42B, 43A, 43B, 44A, 44B, 45A, 45B, 46A, 46B, 47A, 47B, 48A, 48B, 49A and 49B are cross sectional views showing structures in conjunction with a method of manufacturing a semiconductor device according to the sixth embodiment of the present invention.
Figure 42B:
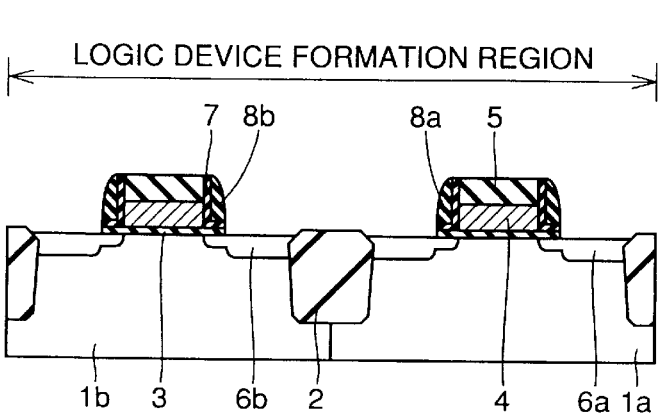

Although not shown in the drawings, a resist film is formed on silicon oxide film 13. To form an SAC opening in the memory device formation region, the resist film is subjected to photolithography. Then, silicon oxide film 13, BPSG film 12, silicon oxide film 9 and BPSG film 17 are sequentially etched using the resist film as a mask. The resist film is removed. This results in the structure shown in FIGS. 40A and 40B. Silicon nitride film 8 and silicon oxide film 7 are sequentially subjected to anisotropic etching using silicon oxide film 13, BPSG film 12, silicon oxide film 9 and BPSG film 17 as masks. This forms an SAC opening 15 such that a protection insulating film is left on the upper surfaces and side walls of the gate electrode as shown in FIGS. 41A and 41B.

In the present embodiment, the memory device formation region is planarized by BPSG film 17 before formation of silicon oxide film 9, which serves as a salicide protection film. Further, referring to FIGS. 35A and 35B, there is not resist film 14 in the memory device formation region when forming the salicide protection film. Thus, when silicon oxide film 9 as the salicide protection film is formed, silicon oxide film 9 in the memory device formation region is removed.

Therefore, in the method of manufacturing the mixed device of the present embodiment, an effect similar that obtained by the method of manufacturing the mixed device of the fourth embodiment is produced. In addition, as silicon oxide film 9 in the memory device formation region is removed, a depth of the self alignment contact hole leading to source/drain region 6a through silicon nitride film 8 and gate insulating film 3 is reduced, so that an etching margin can be increased. Here, the etching margin refers to a tolerance with respect to the actual size. More specifically, it is a tolerance with respect to a preliminary set error to enable good connection to an intended portion if a diameter of the contact hole is greater than designed, or if a position of the contact hole is offset.

Sixth Embodiment

Now, referring to FIGS. 42A to 47A and FIGS. 42B to 47B, the sixth embodiment will be described. In the sixth embodiment, the method of manufacturing the structure shown in FIGS. 42A and 42B includes steps similar to those of the method of manufacturing the structure shown in FIGS. 58A to 61A and FIGS. 58B to 61B.

Figure 43A:
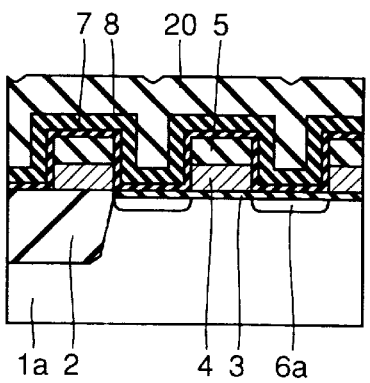
Figure 43B:
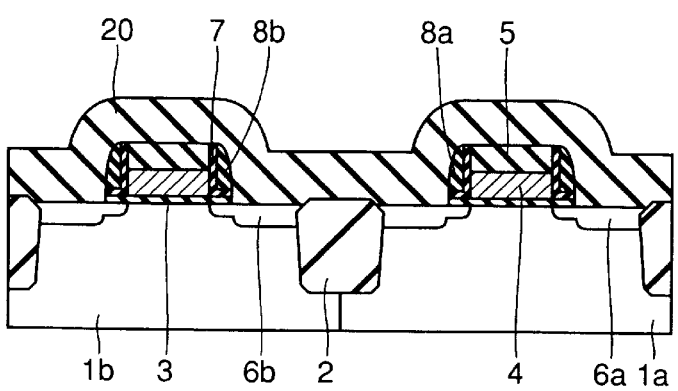
Figure 44A:
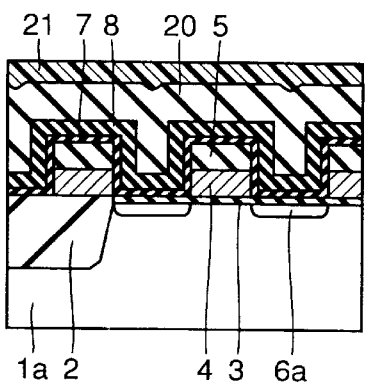
Figure 44B:
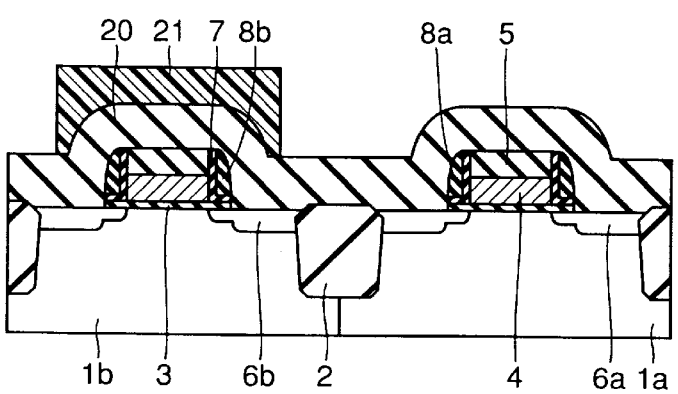
Figure 45A:
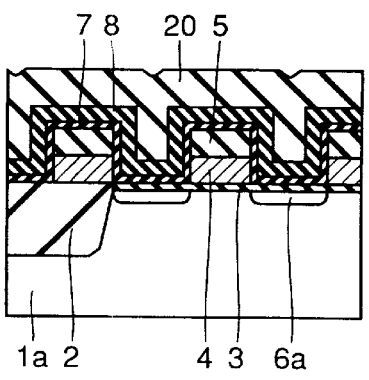
Figure 45B:
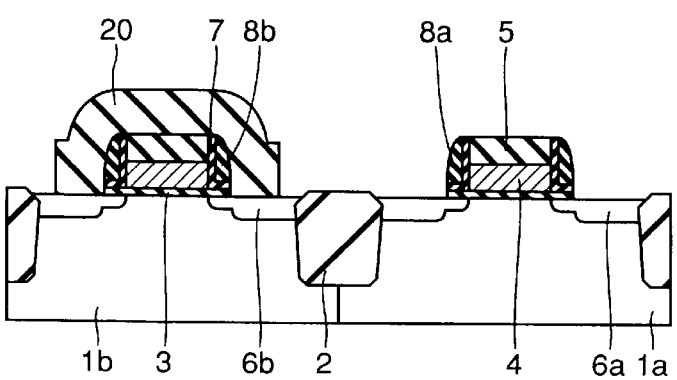

As shown in FIGS. 43A and 43B, a BPSG film is formed to cover the surface of the semiconductor substrate. Then, the BPSG film is planarized by a thermal treatment. At the time, the memory device formation region may have been planarized.

A resist film is formed to cover the entire surface of the semiconductor substrate. Thereafter, photolithography is performed on the resist film such that resist film 21 is left only in the portion where the BPSG film is to be left. Etching the resist film in the portion other than where the BPSG film is left form a resist film 21. This results in a structure shown in FIGS. 44A and 44B. At the time, the memory device formation region is covered with resist film 21.

Then, the BPSG film is subjected to anisotropic etching or isotropic etching using resist film 21 as a mask, and a BPSG film 20 is formed. Thereafter, resist film 21 is removed. This results in a structure shown in FIGS. 45A and 45B. BPSG film 20 serves as a salicide protection film in the logic device.

Figure 46A:
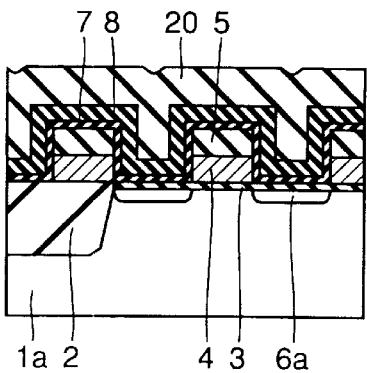
Figure 46B:
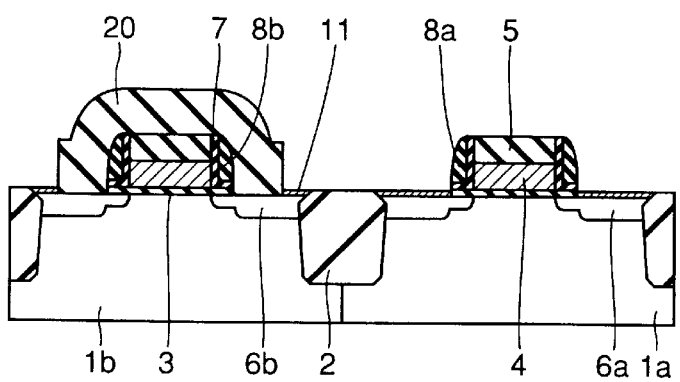
Figure 47A:
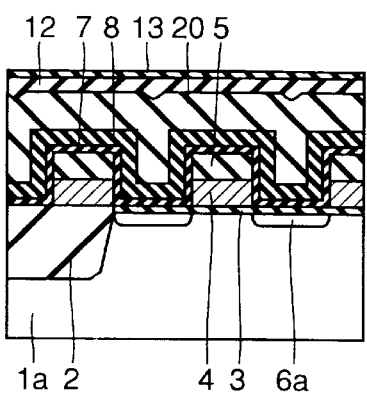
Figure 47B:
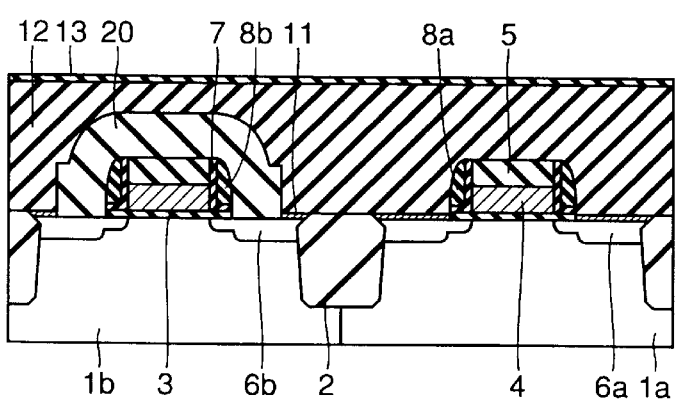

As shown in FIGS. 46A and 46B, a refractory metal silicide film 11 is formed on an active region exposing the semiconductor substrate. Then, BPSG film 12 is formed to cover the entire surface of the semiconductor substrate. BPSG film 12 is planarized for example by a thermal treatment or CMP. Thereafter, as shown in FIGS. 47A and 47B, a silicon oxide film 13 is formed on BPSG film 12. At the time, the memory device formation region has been planarized by the step shown in FIGS. 43A and 43B. If the logic device formation region needs not be planarized, only silicon oxide film 13 may be formed to cover the main surface of the semiconductor substrate.

It is noted that although the surface of BPSG film 12 is planarized by CMP in the structure shown in FIGS. 47A and 47B, when the thermal treatment is employed, there would be some step between the memory device formation region and the logic device formation region due to a difference in thickness of the interlayer insulating film.

Figure 48A:
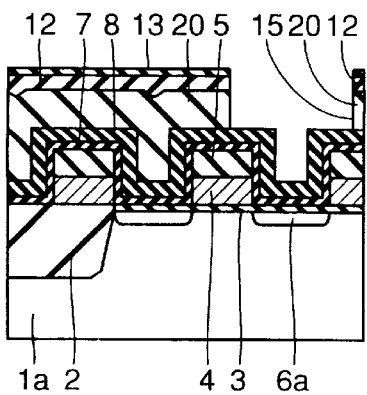
Figure 48B:
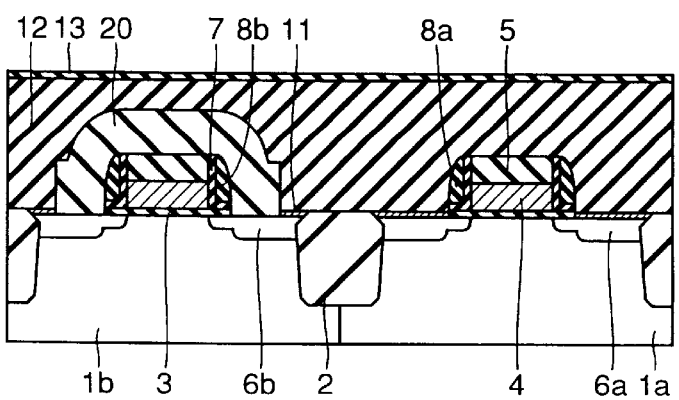
Figure 49A:
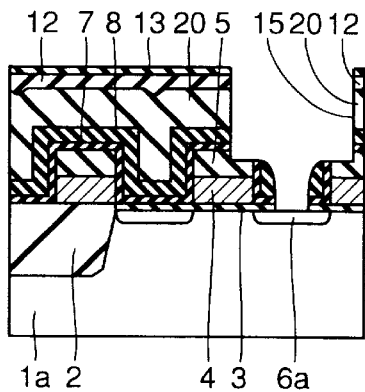
Figure 49B:
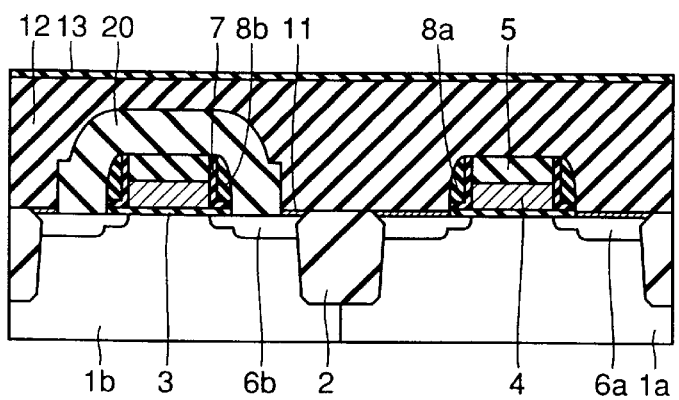

Subsequently, although not shown in the drawings, a resist film is formed on silicon oxide film 13. The resist film is subjected to photolithography to form an SAG opening in the memory device formation region. Then, silicon oxide film 13, BPSG film 12, silicon oxide film 9 and BPSG film 17 are sequentially etched using the resist film as a mask. Then, the resist film is removed. This results in a structure shown in FIGS. 48A and 48B. Silicon nitride film 8 and silicon oxide film 7 are sequentially subjected to anisotropic etching using silicon oxide film 13, BPSG film 12, silicon oxide film 9 and BPSG film 17 as masks. This forms an SAG opening 15 such that a protection insulating film is left on the upper surfaces and sidewalls of the gate electrodes as shown in FIGS. 49A and 49B.

According to the method of manufacturing the mixed device of the present invention, the recess of silicon nitride film 8 formed between the gate electrodes in the memory device formation region is filled with BPSG film 20. As BPSG film 20 includes impurities, it is easily etched. Accordingly, the silicon oxide film as a salicide protection film would not be left on the inner surface of the recess of silicon nitride film 8 as in the conventional case. As a result, reliability of the semiconductor device increases as in the method of manufacturing the mixed device in each of the first to fifth embodiments.

Seventh Embodiment

Referring to FIGS. 50A to 55A and FIGS. 50B to 55B, the seventh embodiment will be described.

A method of manufacturing a mixed device of the present embodiment is essentially performed by steps similar to those of the method manufacturing the mixed device of the sixth embodiment. In the method of manufacturing the mixed device of the present embodiment, however, a silicon oxide film 22, such as a TEOS oxide film 8 represented by a chemical formula $Si(OC_2H_5)_4$, is formed before formation of a BPSG film 20 in the steps shown in FIGS. 43A and 43B of the method of manufacturing the mixed device of the sixth embodiment. Thus, two layers of BPSG film 20 and silicon oxide film 22 are used as salicide protection films.

Figure 50A:
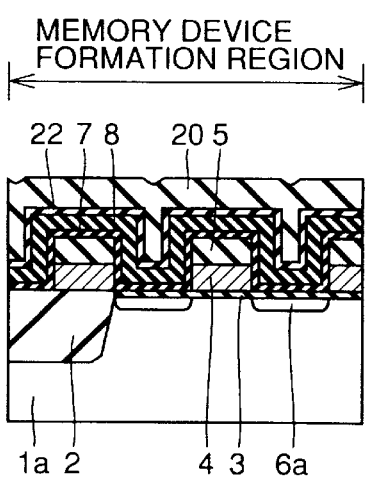
FIGS. 50A, 50B, 51A, 51B, 52A, 52B, 53A, 53B, 54A, 54B, 55A, 55B, 56A, 56B, 57A and 57B are cross sectional views showing structures in conjunction with a method of manufacturing a semiconductor device according to the seventh embodiment of the present invention.
Figure 50B:
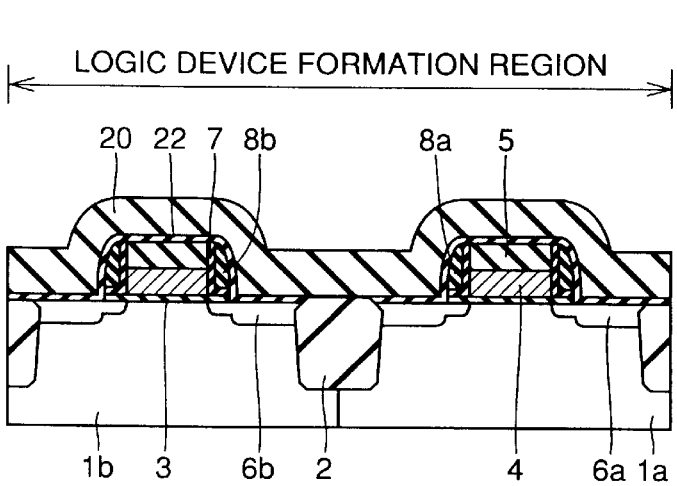
Figure 51A:
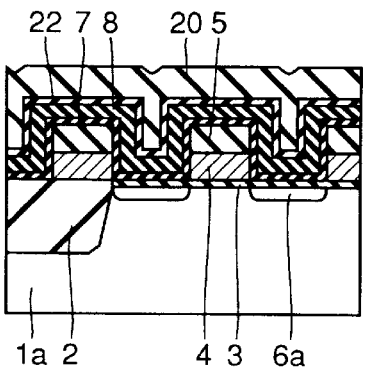
Figure 51B:
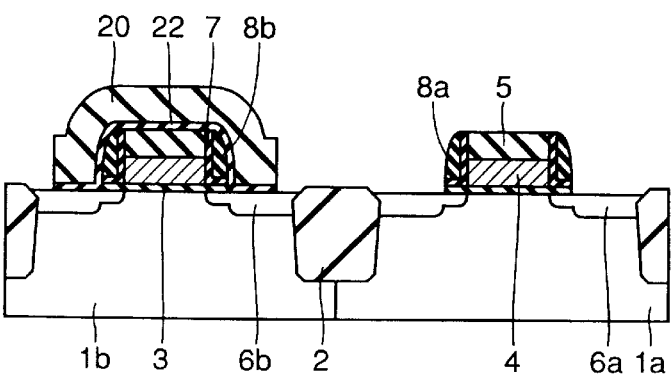

Referring to FIGS. 50A and 50B, the surface of BPSG film 12 is planarized by a thermal treatment after forming silicon oxide film 22 such as the TEOS oxide film. At the time, the memory device formation region may have been planarized.

Then, a resist film is formed to cover the entire surface of the semiconductor substrate. The resist film is then subjected to photolithography such that the resist film is left only in the portion where the BPSG film is to be left. Etching the resist film in the portion other than where the BPSG film is to be left forms a resist film. At the time, the memory device formation region is covered with the resist film.

BPSG film 20 and silicon oxide film 22 are subjected to anisotropic etching or isotropic etching using the resist film as a mask. Then, the resist film is removed. This results in a structure shown in FIGS. 51A and 51B. BPSG film 20 serves as a salicide protection film in the logic device.

Figure 52A:
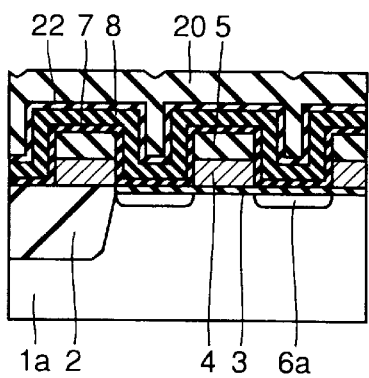
Figure 52B:
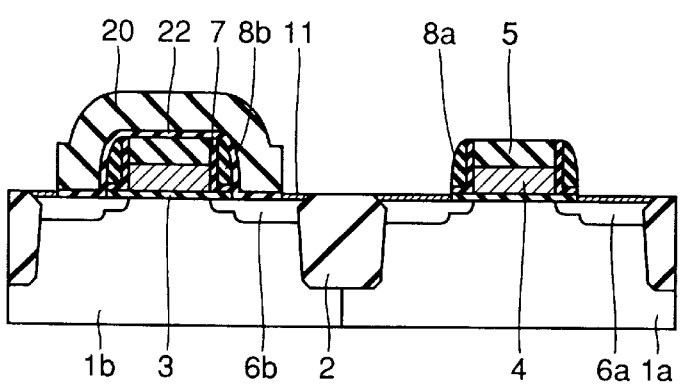
Figure 53A:
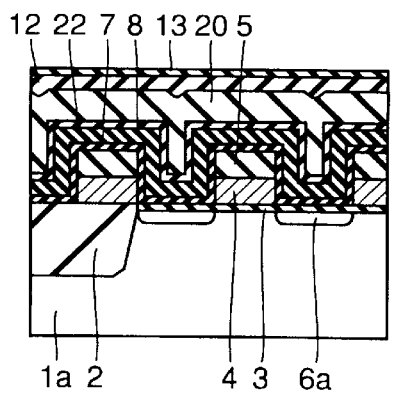
Figure 53B:
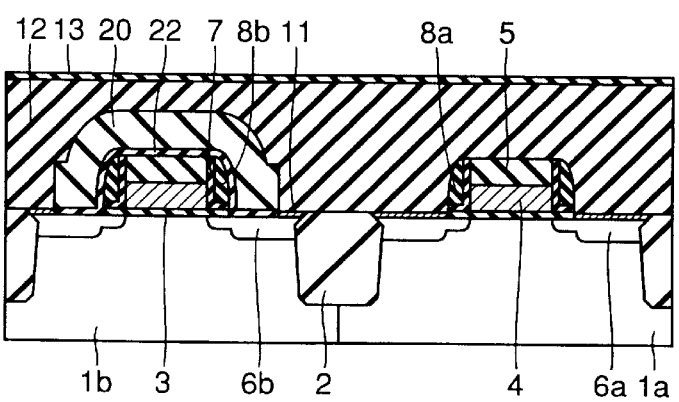
Figure 54A:
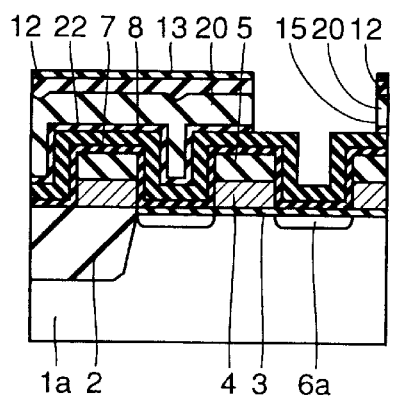
Figure 54B:
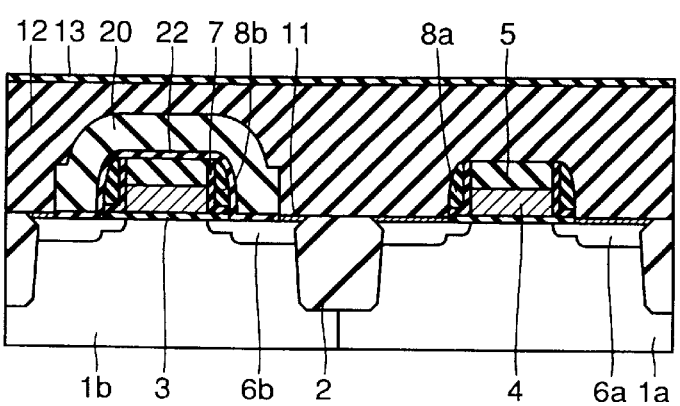
Figure 55A:
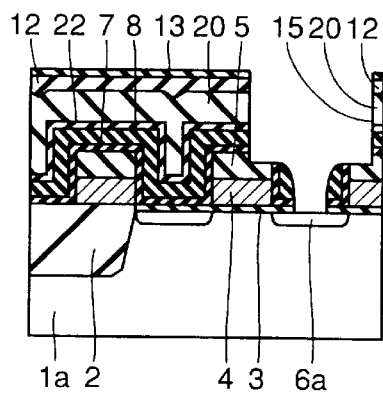
Figure 55B:
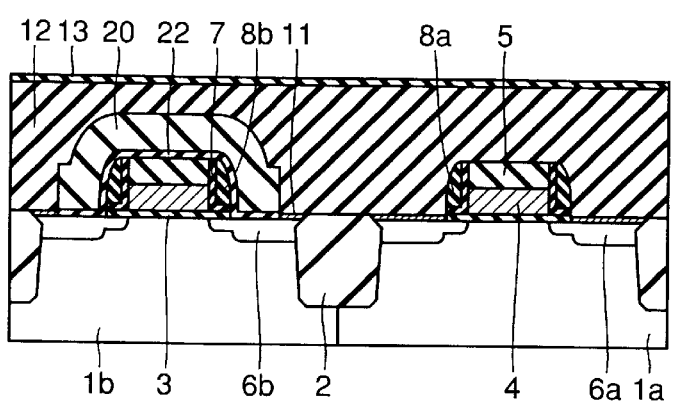
Figure 56A:
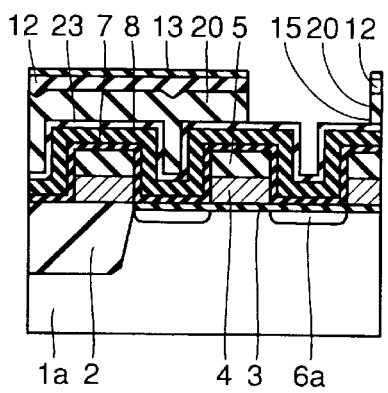
Figure 56B:
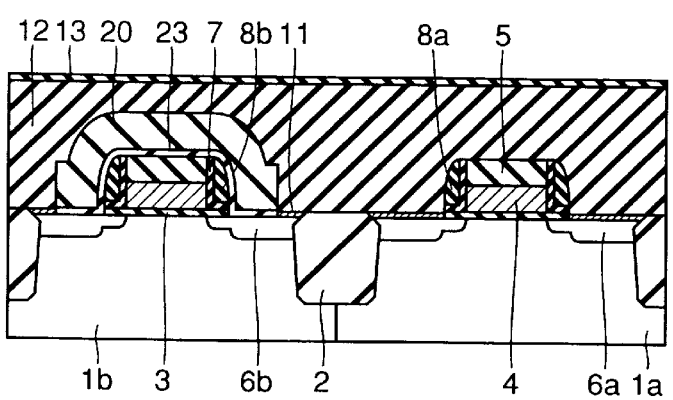

Then, as shown in FIGS. 52A and 52B, a refractory metal silicide film 11 is formed on an active region exposing the semiconductor substrate. A BPSG film 12 is formed to cover the entire surface of the semiconductor substrate. BPSG film 12 is planarized for example by a thermal treatment or CMP. Then, a silicon oxide film 13 is formed on BPSG film 12 as shown in FIGS. 53A and 53B. At the time, the memory device formation region has been planarized in the step shown in FIGS. 50A and 50B. If the logic device formation region needs not be planarized, only silicon oxide film 13 may be formed to cover the main surface of the semiconductor substrate.

It is noted that, in the structure shown in FIGS. 53A and 53B, the surface of BPSG film 12 is planarized by CMP. If the thermal treatment is employed, there would be some step between the memory device formation region and the logic device formation region due to a difference in thickness of the interlayer insulating films.

Although not shown in the drawings, a resist film is formed on silicon oxide film 13. Then, the resist film is subjected to photolithography to form an SAC opening in the memory device formation region. Thereafter, silicon oxide film 13, BPSG film 12, silicon oxide film 9 and BPSG film 12, 20 are sequentially etched using the resist film as a mask. The resist film is then removed. This results in a structure shown in FIGS. 55A and 55B. Silicon nitride film 8 and silicon oxide film 7 are sequentially subjected to anisotropic etching using silicon oxide film 13, BPSG film 12, 20 and silicon oxide film 9 as masks. This forms an SAG opening 15 such that a protection insulating film is left on the upper surfaces and sidewalls of the gate electrodes as shown in FIGS. 49A and 49B.

According to the method of manufacturing the mixed device of the present invention, an effect similar to that obtained by the method of manufacturing the mixed device of the sixth embodiment is produced. In the logic device formation region shown in FIGS. 43A and 43B according to the method of manufacturing the mixed device of the sixth embodiment, BPSG film 20 is formed immediately on the semiconductor substrate. Thus, boron or phosphorus may be diffused into the semiconductor substrate by a subsequent thermal treatment, so that the transistor may adversely be affected for example by a leakage current. In the method of manufacturing the mixed device of the present embodiment, however, formation of silicon oxide film 22 between refractory metal silicide film 11 and BPSG film 20 prevents diffusion of boron or phosphorus into the semiconductor substrate, so that the transistor is not adversely affected.

Eighth Embodiment

Referring to FIGS. 56A, 56B, 57A and 57B, the eighth embodiment will be described. A method of manufacturing a mixed device of the present embodiment is basically the same as that of the seventh embodiment. However, the method of manufacturing the mixed device of the present embodiment differs from that of the seventh embodiment in that two layers of silicon nitride film 23 and BPSG film 20 are used as salicide protection films as silicon nitride film 23 is formed in place of silicon oxide film 22 formed in the step shown in FIGS. 50A and 50B.

In the structure shown in FIGS. 50A and 50B, BPSG film 12 is formed to cover the entire surface of the semiconductor substrate. Then, BPSG film 12 is planarized for example by a thermal treatment or CMP. A silicon oxide film 13 is formed on BPSG film 12.

Figure 57A:
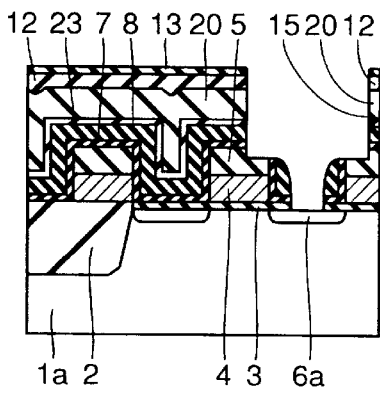
Figure 57B:
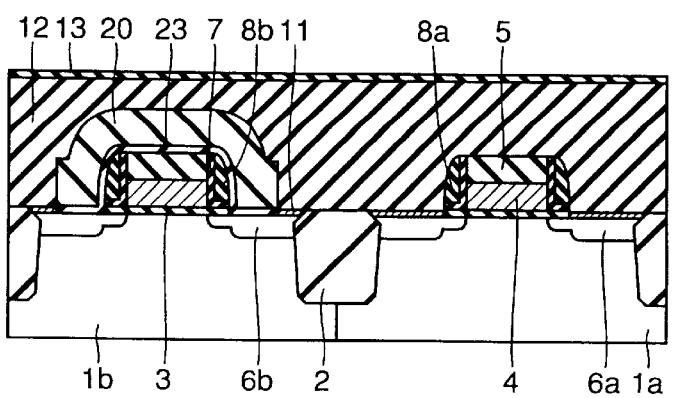
Figure 61A:
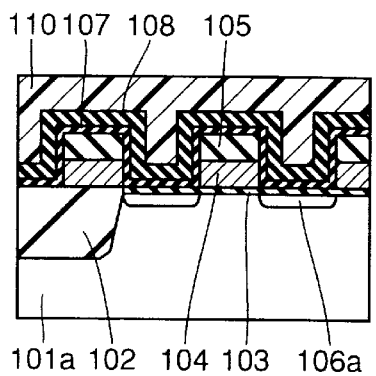
Figure 61B:
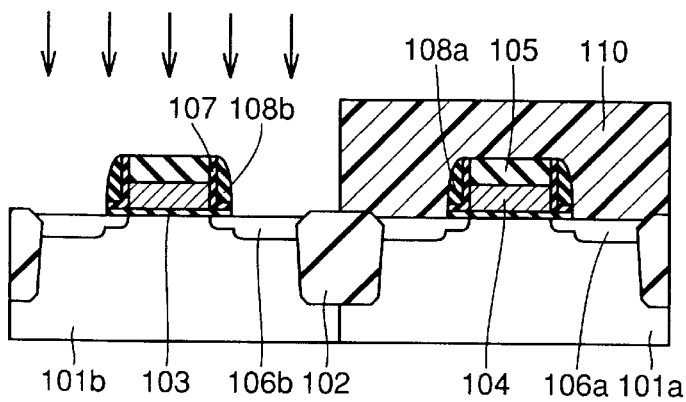
Figure 62A:
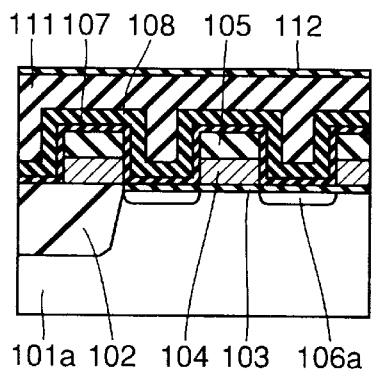
Figure 62B:
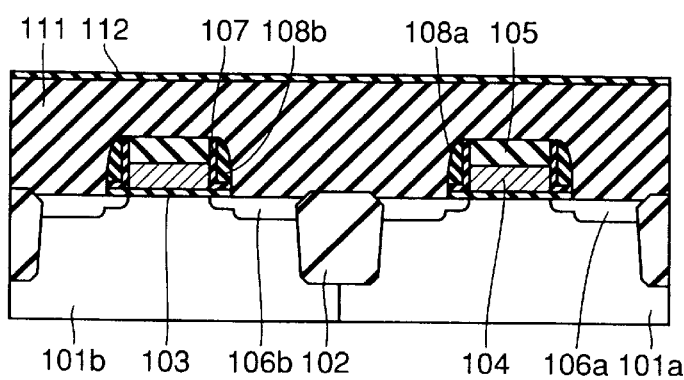
Figure 63A:
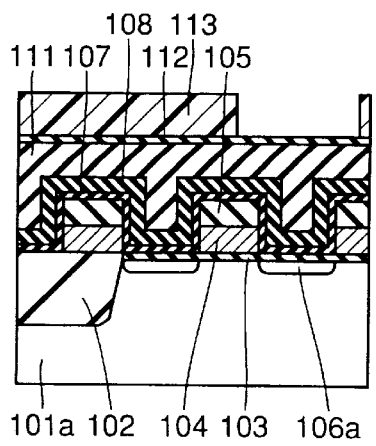
Figure 63B:
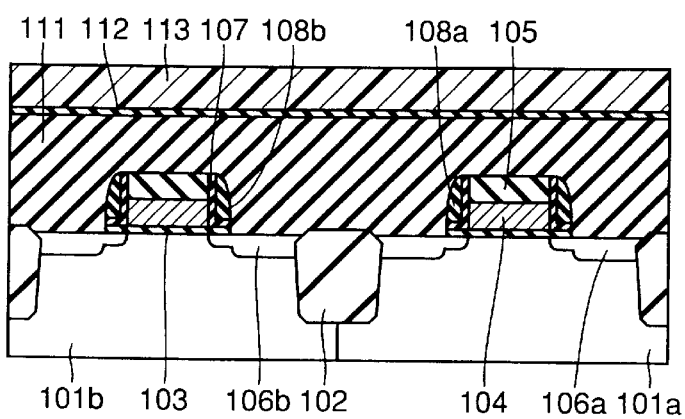
Figure 64A:
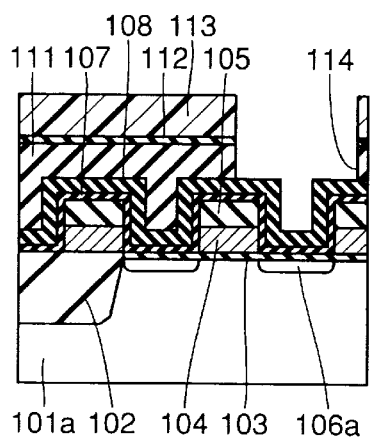
Figure 64B:
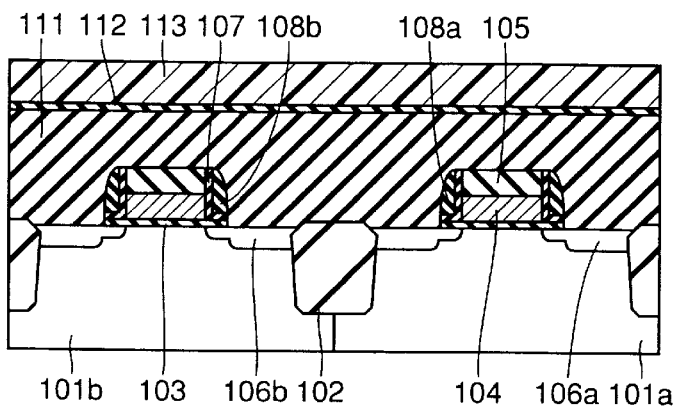
Figure 65A:
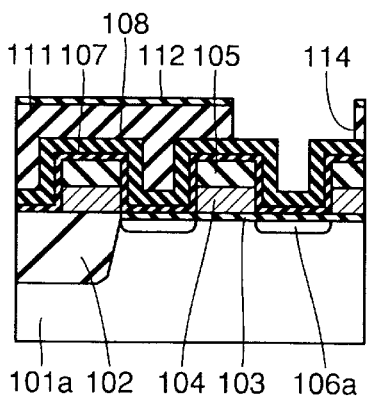
Figure 65B:
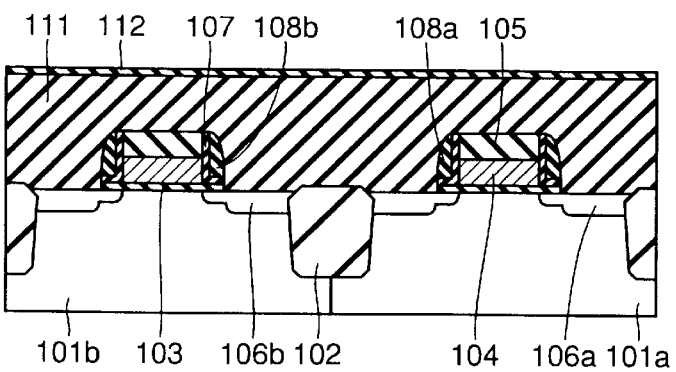
Figure 66A:
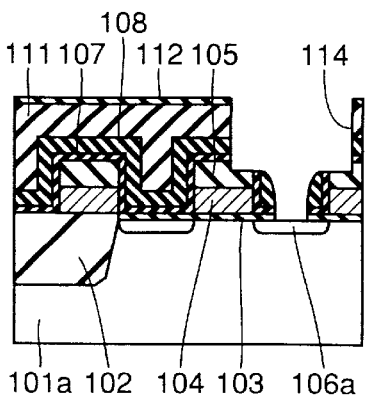
Figure 66B:
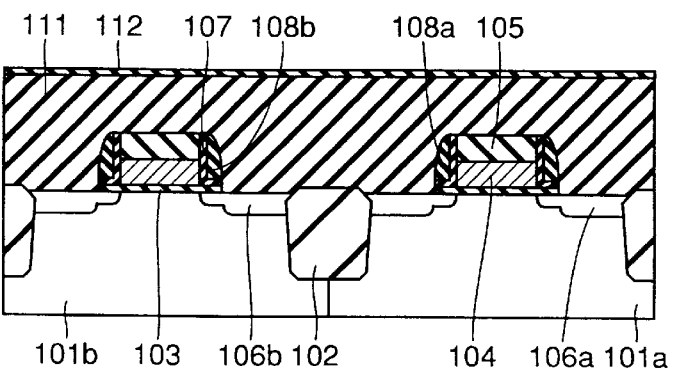
Figure 67:
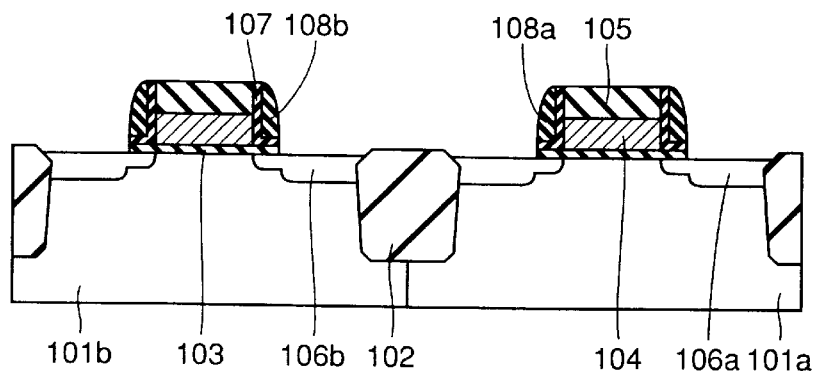
FIGS. 67 to 72 are cross sectional views showing structures in conjunction with a process of forming a salicide protection film for a conventional logic device.
Figure 68:
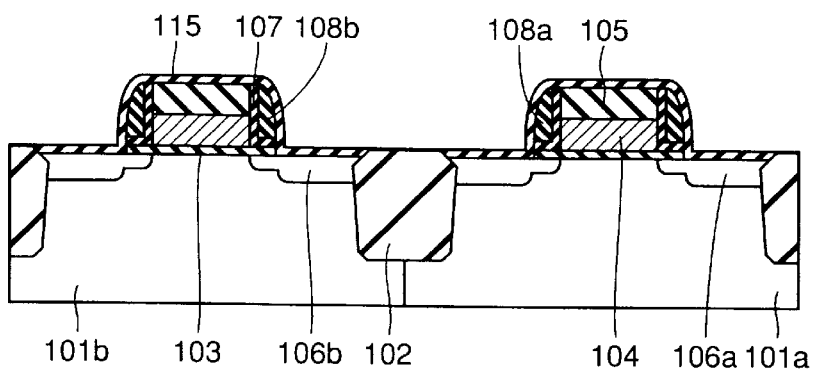
Figure 69:
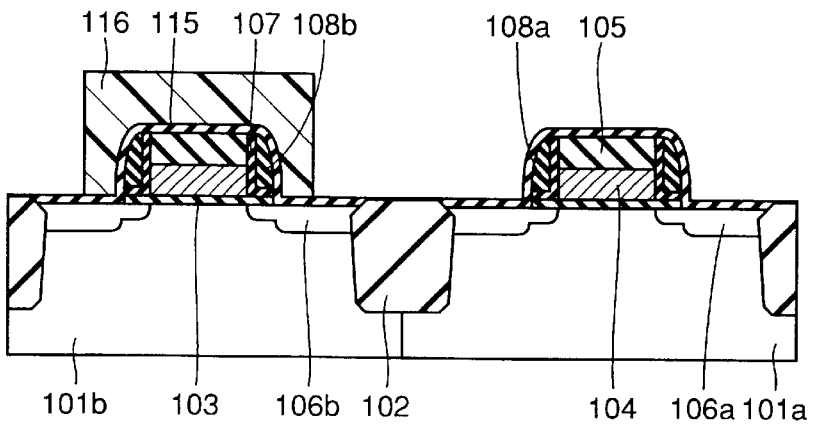
Figure 70:
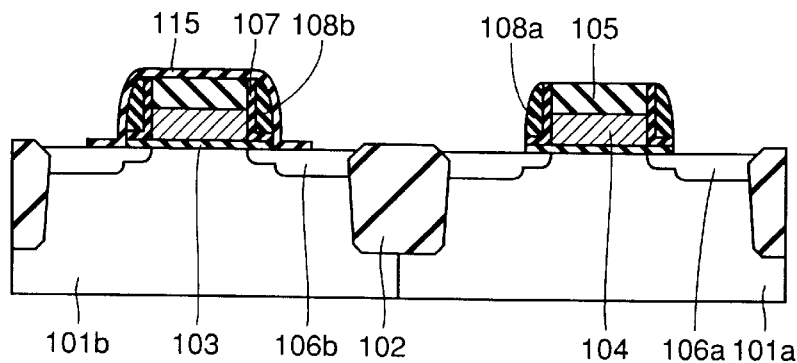
Figure 71:
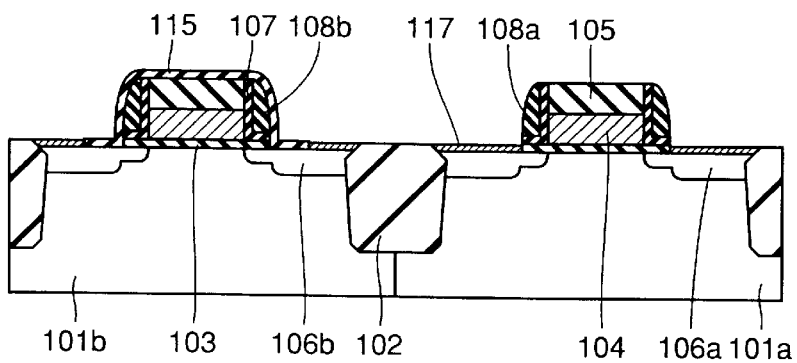
Figure 72:
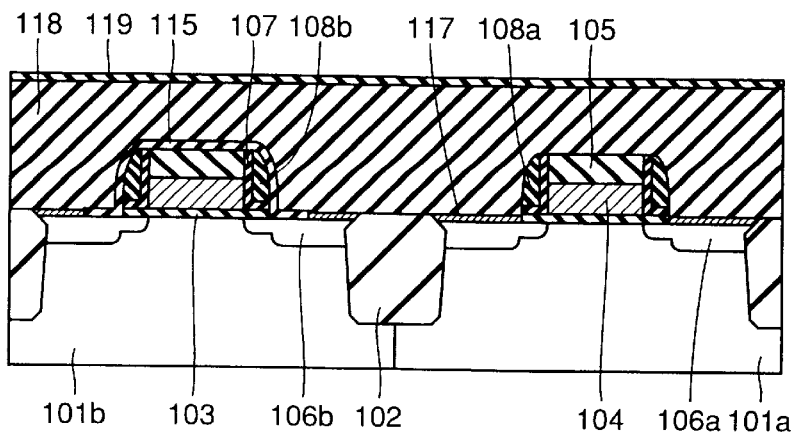
Figure 73A:
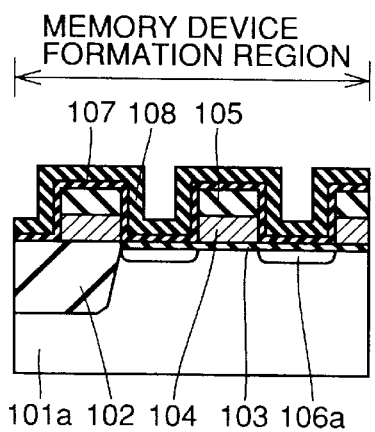
FIGS. 73A, 73B, 74A, 74B, 75A, 75B, 76A, 76B, 77A, 77B, 78A, 78B, 79A, 79B, 80A, 80B, 81A and 81B are cross sectional views showing structures in conjunction with a problem associated with a process of forming a conventional mixed device.
Figure 73B:
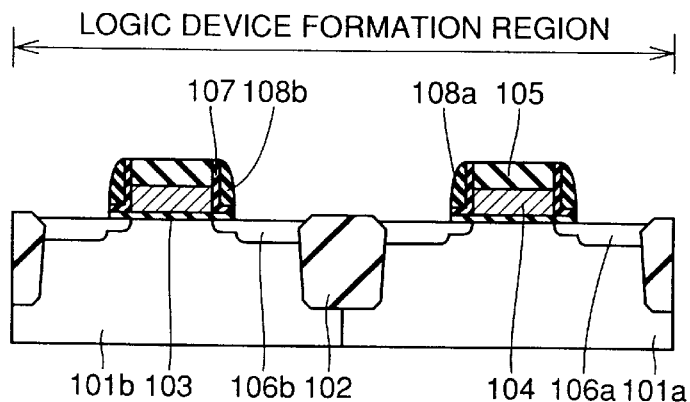
Figure 74A:
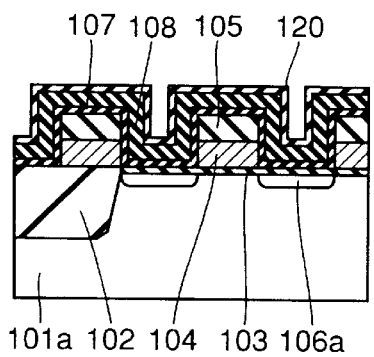
Figure 74B:
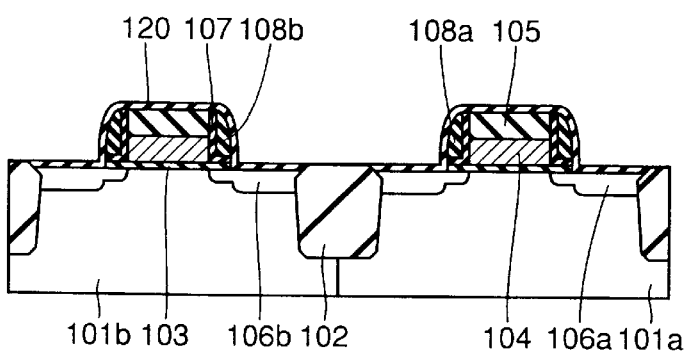
Figure 75A:
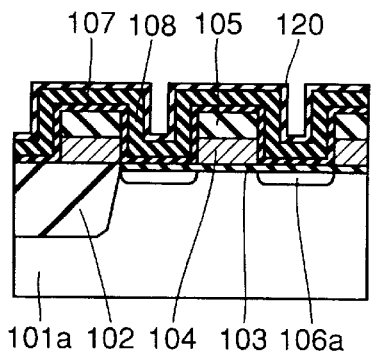
Figure 75B:
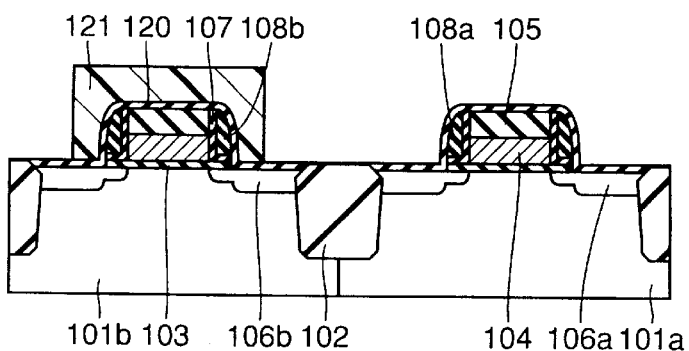
Figure 76A:
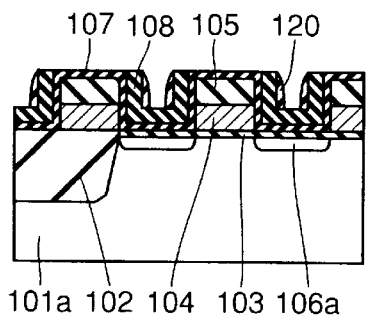
Figure 76B:
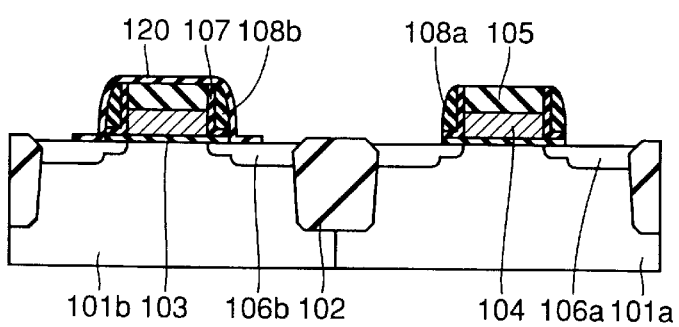
Figure 77A:
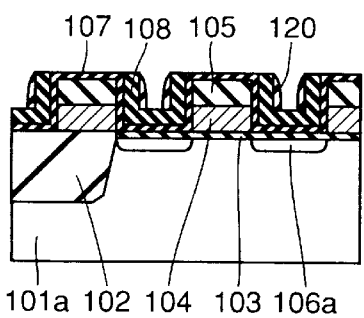
Figure 77B:
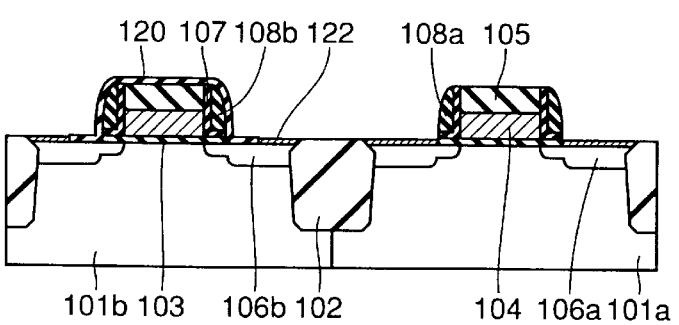
Figure 78A:
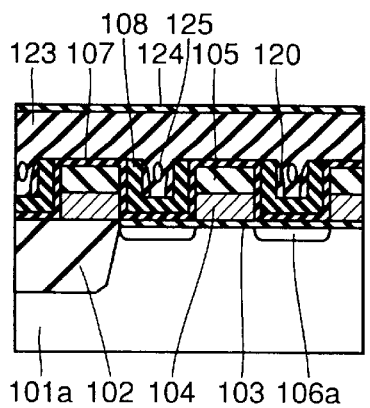
Figure 78B:
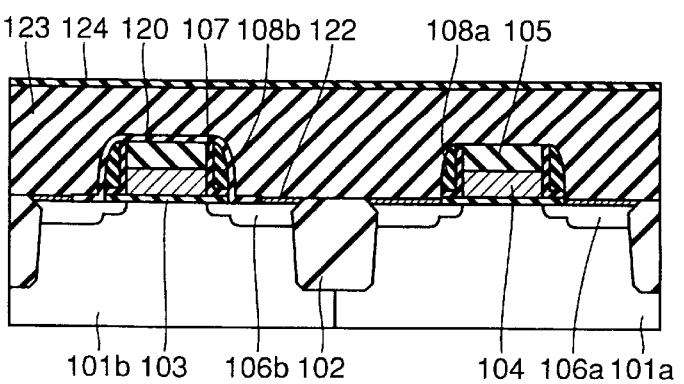
Figure 79A:
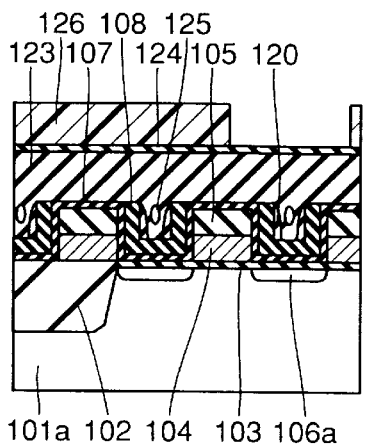
Figure 79B:
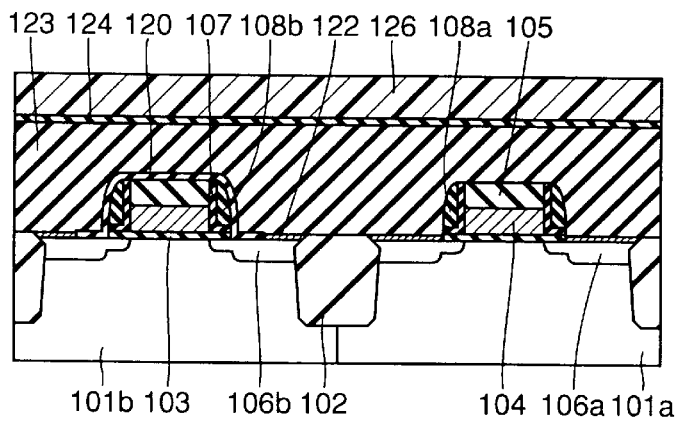
Figure 80A:
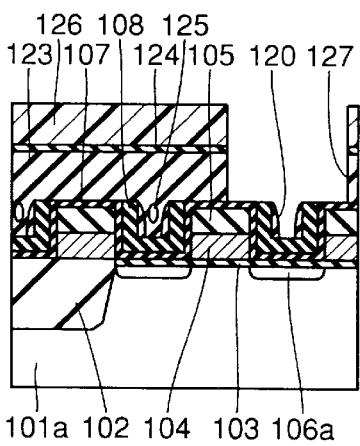
Figure 80B:
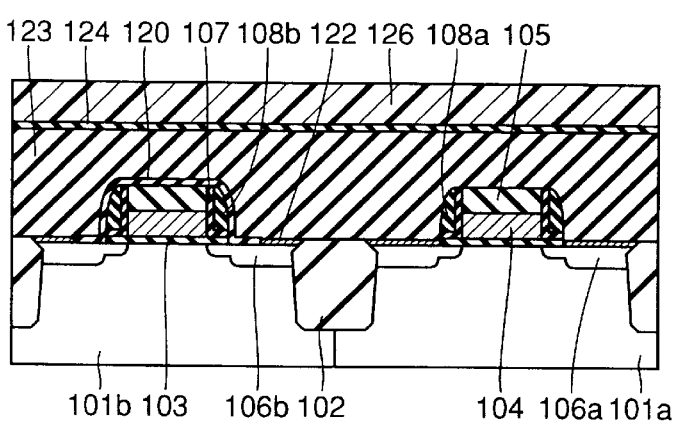
Figure 81A:
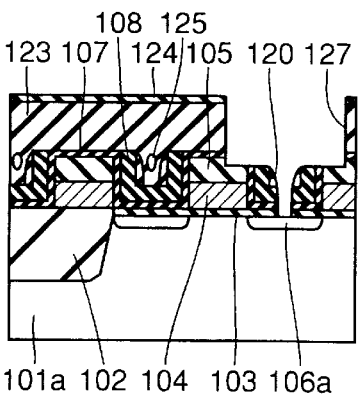
Figure 81B:
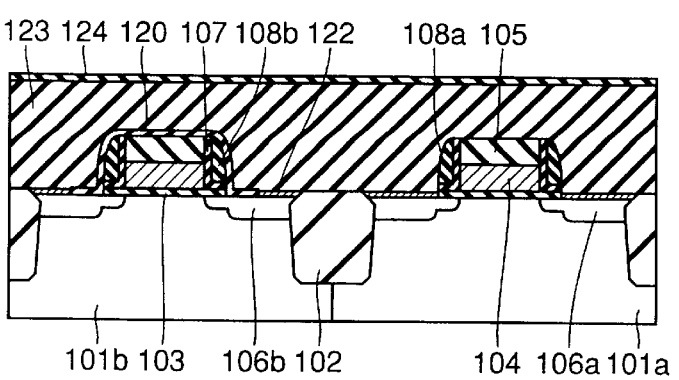

A resist film is formed on silicon oxide film 13. The resist film is subjected to photolithography to form an SAG opening in the memory device formation region. Thereafter, silicon oxide film 13, BPSG film 12, silicon oxide film 9 and BPSG film 17 are sequentially etched using the resist film as a mask. The resist film is then removed. This results in a structure shown in FIGS. 57A and 57B. Silicon nitride film 8 and silicon oxide film 7 are sequentially subjected to anisotropic etching using silicon oxide film 13, BPSG film 12, silicon oxide film 9 and BPSG film 17 as masks. Thus, as shown in FIGS. 57A and 57B, an SAG opening 15 is formed such that a protection insulating film is left on the upper surfaces and sidewalls of gate electrodes.

The method of manufacturing the mixed device of the present embodiment produces an effect similar to that obtained by the method of manufacturing the mixed device of the seventh embodiment. Further, in the methods of manufacturing the mixed device of the sixth and seventh embodiments, the semiconductor substrate is oxidized. Thus, planarization of BPSG film 20 by the thermal treatment cannot be performed in an oxidation atmosphere including for example hydrogen and oxygen. It can only be performed in a non-oxidation atmosphere such as a nitrogen atmosphere. However, according to the method of manufacturing the mixed device of the present embodiment, the silicon nitride film prevents oxidation of the semiconductor substrate, thereby enabling planarization by the thermal treatment in the oxidation atmosphere. As a result, according to the method of manufacturing the mixed device of the present embodiment, better planarization is achieved as compared with the case where the semiconductor substrate and refractory metal silicide film are planarized by the thermal treatment in the non-oxidation atmosphere.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a memory device formation region and a logic device formation region on a semiconductor substrate, comprising the steps of:

forming first and second gate electrodes on said semiconductor substrate in said memory device formation region and forming a third gate electrode on said semiconductor substrate in said logic device formation region;

forming first source/drain regions in said semiconductor substrate on both sides of said first and second gate electrodes and forming second source/drain regions in said semiconductor substrate on both sides of said third gate electrode;

forming a first insulating film on an entire surface of said semiconductor substrate to cover said first, second and third gate electrodes;

performing anisotropic etching on said first insulating film formed in said logic device formation region to leave a first protection insulating film covering said first and second gate electrodes in said memory device formation region, and forming a sidewall insulating film on a side wall of said third gate electrode;

forming a second insulating film to cover said entire surface of said semiconductor substrate including said first, second and third gate electrodes, said protection insulating film, and sidewall insulating film;

selectively performing wet etching on said second insulating film in said memory device region to form a salicide protection film in said logic device formation region;

forming a refractory metal silicide film on said second source/drain region exposing said semiconductor substrate in said logic device formation region;

forming an interlayer insulating film to cover said entire surface of said semiconductor substrate; and etching said interlayer insulating film and said first protection insulating film in said memory device formation region to form a contact hole leading to said first source/drain region of said semiconductor substrate in a self-aligning manner such that a second protection insulating film is left on upper surfaces and side walls of said first and second gate electrodes.

2. The method of manufacturing the semiconductor device according to claim 1, wherein said first insulating film is a silicon nitride film.

3. The method of manufacturing the semiconductor device according to claim 1, wherein said second insulating film is a silicon oxide film.

4. The method of manufacturing the semiconductor device according to claim 1, wherein said interlayer insulating film is an insulating film including impurities, said method further comprises the step of forming an insulating film not including impurities on said refractory metal silicide film before said step of forming said interlayer insulating film after said step of forming said refractory metal silicide film, and said method further comprises the step of performing a thermal treatment on said interlayer insulating film after said step of forming said interlayer insulating film.

5. The method of manufacturing the semiconductor device according to claim 4, wherein said impurities include at least one of boron and phosphorus.

6. The method of manufacturing the semiconductor device according to claim 4, wherein said insulating film not including said impurities is a silicon oxide film having a thickness of at most 300 Å.

7. The method of manufacturing the semiconductor device according to claim 4, wherein said insulating film not including said impurities is a silicon nitride film having a thickness of at most 300 Å.

8. A method of manufacturing a semiconductor device having a memory device formation region and a logic device formation region on a semiconductor substrate, comprising the steps of:

forming first and second gate electrodes in said memory device formation region and forming a third gate electrode on said semiconductor substrate in said logic device formation region;

forming first source/drain regions in said semiconductor substrate on both sides of said first and second gate electrodes and forming second source/drain regions on both sides of said third gate electrode;

forming a first insulating film on an entire surface of said semiconductor substrate to cover said first, second and third gate electrodes;

forming an insulating film including impurities on said first insulating film;

removing said insulating film including impurities formed in said logic device formation region;

performing anisotropic etching on said first insulating film on said logic device formation region to leave a first protection insulating film in said memory cell formation region and forming a sidewall insulating film in a sidewall of said third gate electrode;

forming a second insulating film to cover said entire surface of the semiconductor substrate;

etching said second insulating film to form a salicide protection film in said logic device formation region;

forming a refractory metal silicide film on said second source/drain region exposing said semiconductor substrate in said logic device formation region;

forming an interlayer insulating film on said semiconductor substrate;

forming a contact hole leading to said first source/drain region of said semiconductor substrate in a self-aligning manner to leave a second protection insulating film on upper surfaces and sidewalls of said first and second gate electrodes in said interlayer insulating film and said insulating film including impurities in said memory device formation region; and performing a thermal treatment on a surface of said silicon oxide film or said interlayer insulating film after one of said step of forming said insulating film including impurities and said step of forming said interlayer insulating film.

9. The method of manufacturing the semiconductor device according to claim 8, wherein said first insulating film is a silicon nitride film.

10. The method of manufacturing the semiconductor device according to claim 8, wherein said second insulating film is a silicon oxide film.

11. The method of manufacturing the semiconductor device according to claim 8, wherein said impurities include at least one of boron and phosphorus.

12. The method of manufacturing the semiconductor device according to claim 8, wherein said silicon oxide film formed in said memory device formation region is completely removed in the step of etching said second insulating film.

13. A method of manufacturing a semiconductor device having a memory device formation region and a logic device formation region on a semiconductor substrate, comprising the steps of:

forming first and second gate electrodes in said memory device formation region and forming a third gate electrode on said semiconductor substrate in said logic device formation region;

forming first source/drain regions in said semiconductor substrate on both sides of said first and second gate electrodes and forming third source/drain regions in said semiconductor substrate on both sides of said third gate electrode;

forming a first insulating film on an entire surface of said semiconductor substrate to cover said first, second and third gate electrodes;

performing anisotropic etching on said first insulating film formed in said logic device formation region to leave a first protection insulating film in said memory device formation region and forming a sidewall insulating film on a sidewall of said third gate electrode;

forming an insulating film including impurities on said entire surface of said semiconductor substrate;

etching said insulating film including impurities to form a salicide protection film in said logic device formation region;

forming a refractory metal silicide film on said second source/drain region exposing said semiconductor substrate in said logic device formation region;

forming an interlayer insulating film on said semiconductor substrate; and forming a contact hole leading to said first source/drain region of said semiconductor substrate in a self-aligning manner to leave a second protection insulating film on upper surfaces and sidewalls of said first and second gate electrodes in said interlayer insulating film and said insulating film including impurities in said memory device formation region.

14. The method of manufacturing the semiconductor device according to claim 13, wherein said first insulating film is a silicon nitride film.

15. The method of manufacturing the semiconductor device according to claim 13, wherein said second insulating film is a silicon oxide film.

16. The method of manufacturing the semiconductor device according to claim 13, wherein said impurities include at least one of boron and phosphorus.

17. The method of manufacturing the semiconductor device according to claim 13, further comprising the steps of:

forming an insulating film not including impurities on said entire surface of said semiconductor substrate before said step of forming said insulating film including impurities on said entire surface of said semiconductor substrate; and performing a thermal treatment on said insulating film including impurities.

18. The method of manufacturing the semiconductor device according to claim 17, wherein said insulating film not including impurities is a silicon oxide film having a thickness of at most 300 Å.

19. The method of manufacturing the semiconductor device according to claim 17, wherein said insulating film not including impurities is a silicon nitride film having a thickness of at most 300 Å.

* * * * *